United States Patent
Ghosh et al.

(10) Patent No.: US 10,439,912 B2
(45) Date of Patent: Oct. 8, 2019

(54) SYSTEMS AND METHODS FOR INTELLIGENT CONTROLS FOR OPTIMAL RESOURCE ALLOCATION FOR DATA CENTER OPERATIONS

(71) Applicant: AdeptDC co., Atlanta, GA (US)

(72) Inventors: Rajat Ghosh, Atlanta, GA (US); Yogendra Kumar Joshi, Atlanta, GA (US)

(73) Assignee: AdeptDC Co., Atlanta, GA (US)

( * ) Notice: Subject to any disclaimer, the term of this patent is extended or adjusted under 35 U.S.C. 154(b) by 257 days.

(21) Appl. No.: 15/123,016

(22) PCT Filed: Mar. 4, 2015

(86) PCT No.: PCT/US2015/018805
§ 371 (c)(1),
(2) Date: Sep. 1, 2016

(87) PCT Pub. No.: WO2015/134655
PCT Pub. Date: Sep. 11, 2015

(65) Prior Publication Data
US 2017/0187592 A1     Jun. 29, 2017

Related U.S. Application Data

(60) Provisional application No. 61/948,151, filed on Mar. 5, 2014.

(51) Int. Cl.
*G05B 13/04*      (2006.01)
*H04L 12/26*      (2006.01)
(Continued)

(52) U.S. Cl.
CPC .......... *H04L 43/0817* (2013.01); *F03D 7/04* (2013.01); *G05B 13/04* (2013.01); *G05B 13/047* (2013.01);
(Continued)

(58) Field of Classification Search
CPC ... H04L 41/145; H04L 41/14; H04L 43/0817; G05B 19/41885; G05B 13/047;
(Continued)

(56) References Cited

U.S. PATENT DOCUMENTS

| | | | |
|---|---|---|---|
| 9,551,322 B2 * | 1/2017 | Ambekar | ................ F03D 17/00 |
| 2005/0210437 A1 * | 9/2005 | Shi | ............................ G03F 1/36 |
| | | | 716/52 |

(Continued)

FOREIGN PATENT DOCUMENTS

WO    WO-2013/0128468    9/2013

OTHER PUBLICATIONS

International Search Report & Written Opinion on PCT/US2015/018805 dated Sep. 3, 2015.

*Primary Examiner* — Chirag R Patel
(74) *Attorney, Agent, or Firm* — Foley & Lardner LLP

(57) ABSTRACT

Systems and methods are described herein are directed to determining optimal operating set points in sync with dynamic demand responsive to time-varying events in a data center. The method includes establishing, by a matrix module executing on a computing device, a data matrix of a first set of critical data based on resources in the data center representing dynamic demand, the dynamic demand responsive to the time-varying events in the data center. A decomposition module can generate new critical data based in part on the first set of critical data. A prediction module can determine optimal operating set points using the new critical data. The optimal operating set points for the resources can be transmitted by a communications module to a data center orchestration unit such as a building management module.

20 Claims, 30 Drawing Sheets

(51) Int. Cl.
  *F03D 7/04*    (2006.01)
  *H04L 12/24*   (2006.01)
  *H05K 7/20*    (2006.01)

(52) U.S. Cl.
  CPC .......... *H04L 41/145* (2013.01); *H04L 41/147* (2013.01); *H05K 7/20836* (2013.01)

(58) Field of Classification Search
  CPC ...... G05B 13/042; G05B 13/04; G06Q 10/04; F24F 11/46; F24T 2201/00; F03D 7/04
  See application file for complete search history.

(56) References Cited

U.S. PATENT DOCUMENTS

| | | |
|---|---|---|
| 2010/0076607 A1 | 3/2010 | Ahmed et al. |
| 2010/0076724 A1* | 3/2010 | Brown ................... G06Q 50/04 702/179 |
| 2012/0066526 A1* | 3/2012 | Salsbery ............... G06F 1/3203 713/320 |
| 2012/0101648 A1 | 4/2012 | Federspiel et al. |
| 2013/0096905 A1 | 4/2013 | Iyengar et al. |
| 2013/0133350 A1 | 5/2013 | Reytblat |

* cited by examiner

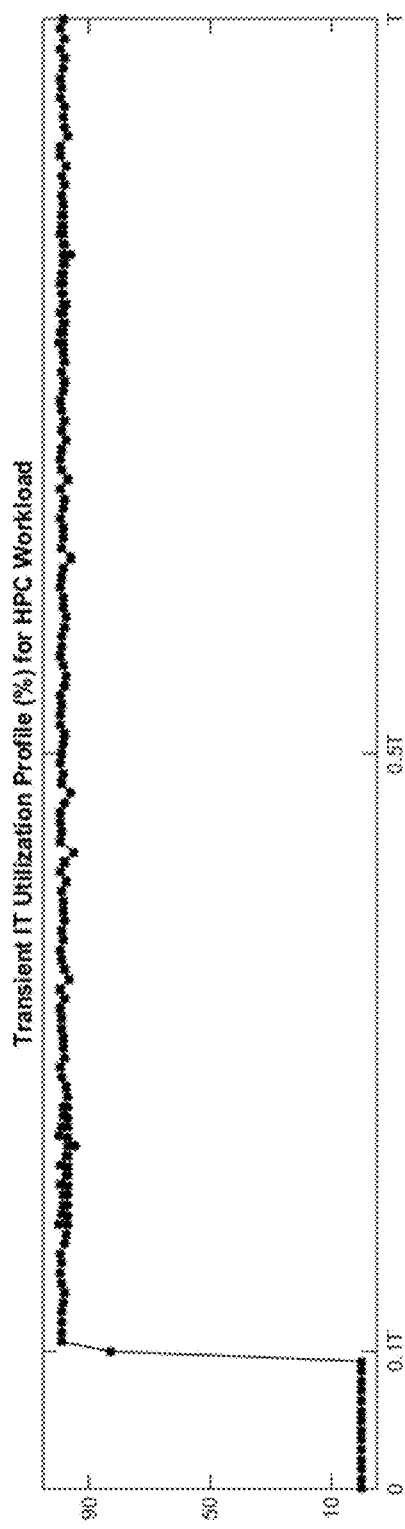
FIG. 3a
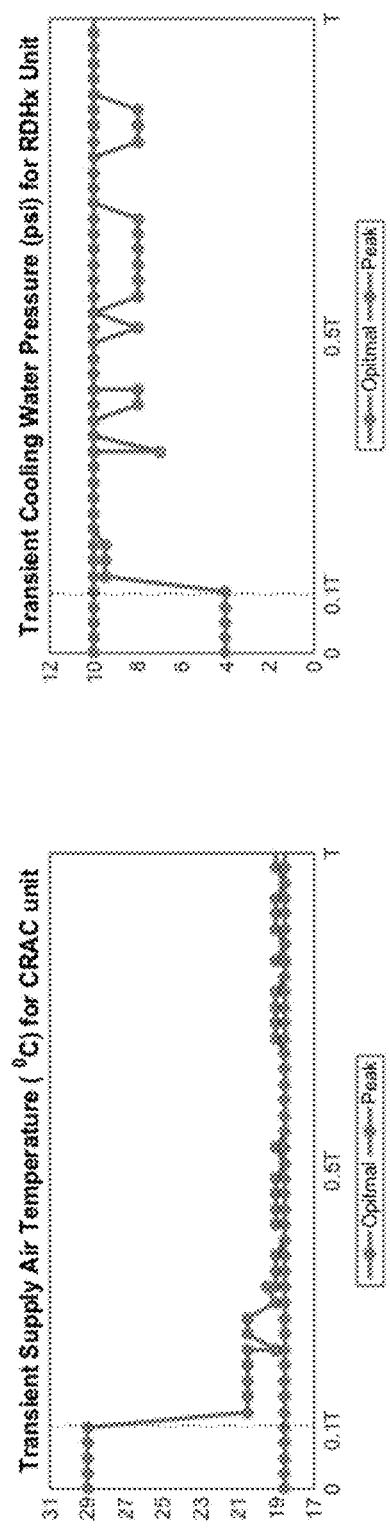
FIG. 3b
FIG. 3c

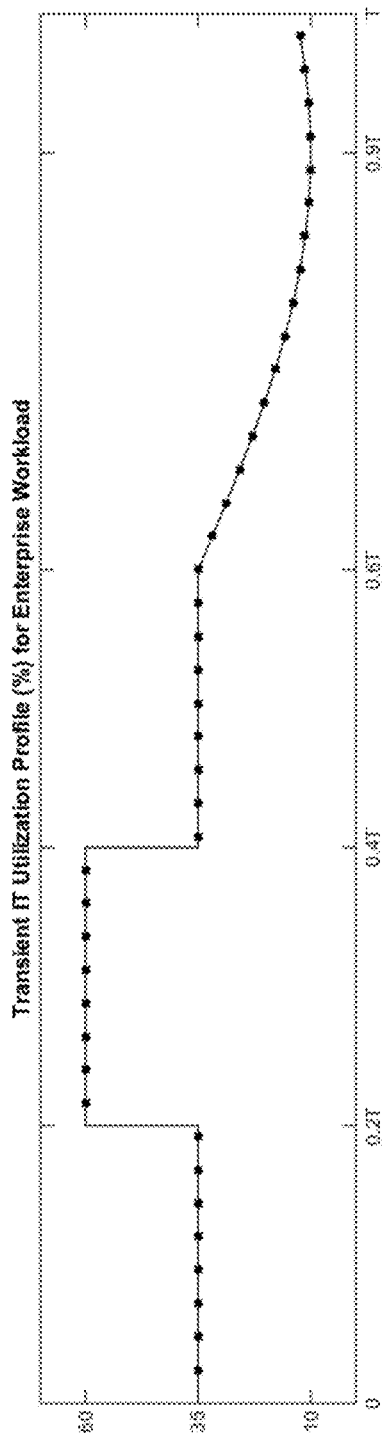
FIG. 3d
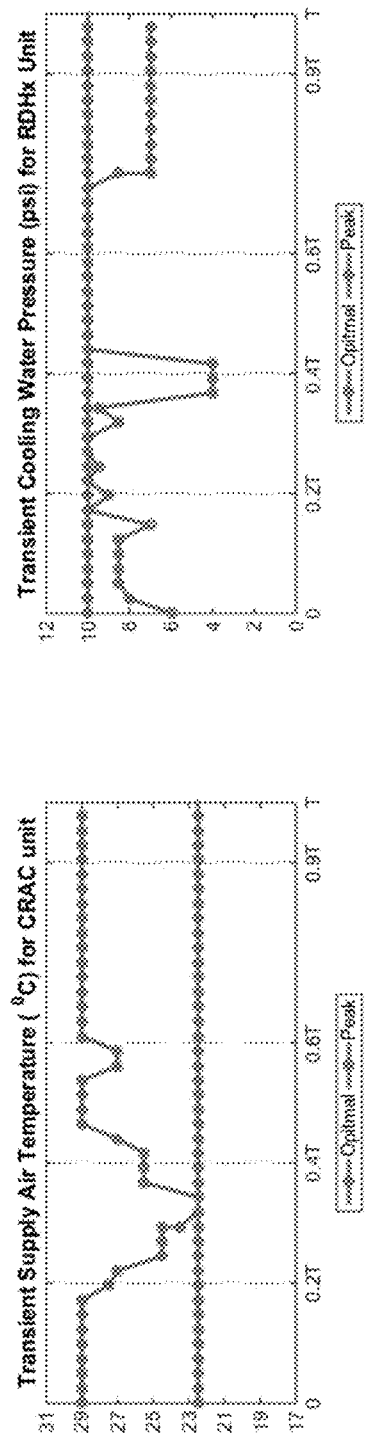
FIG. 3e
FIG. 3f

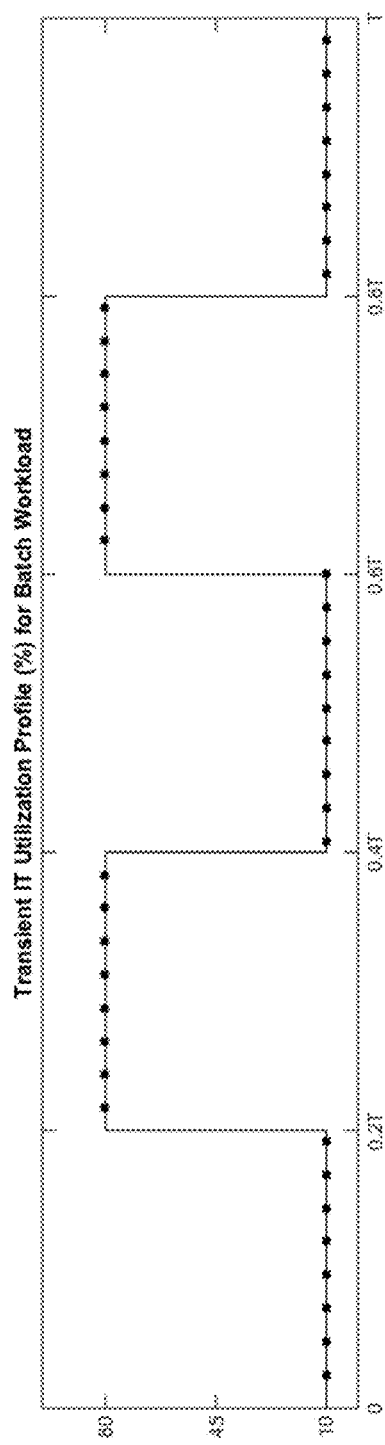
FIG. 3g
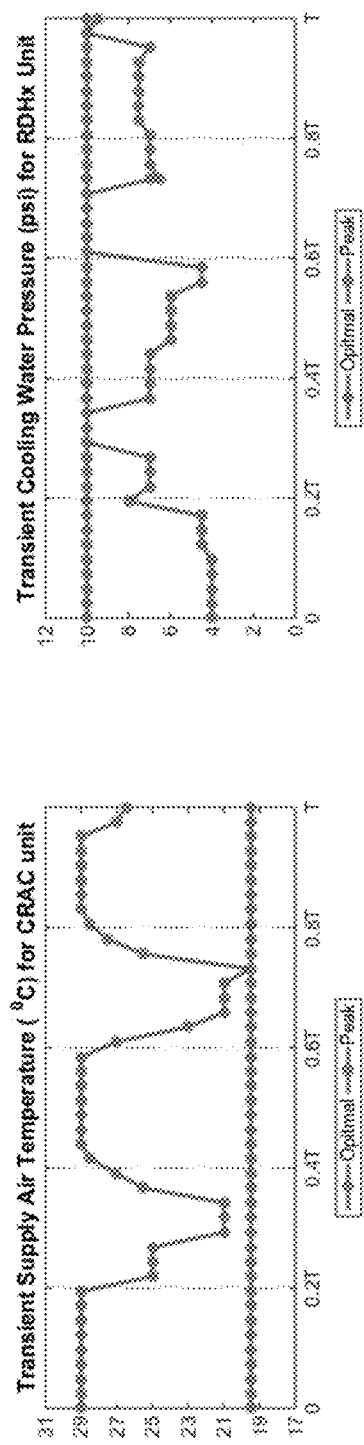
FIG. 3h
FIG. 3i

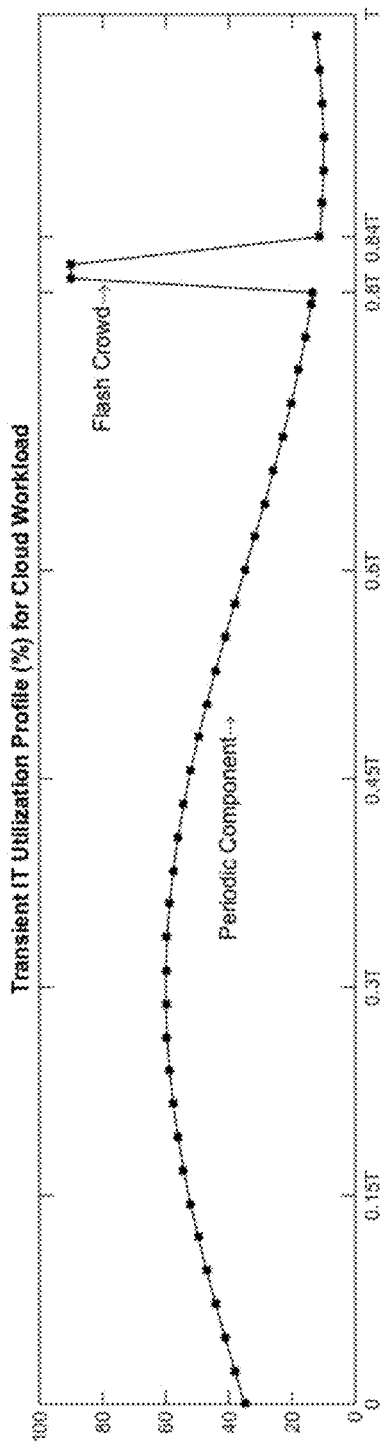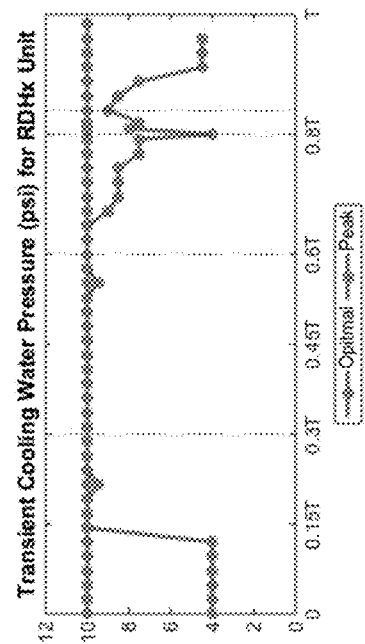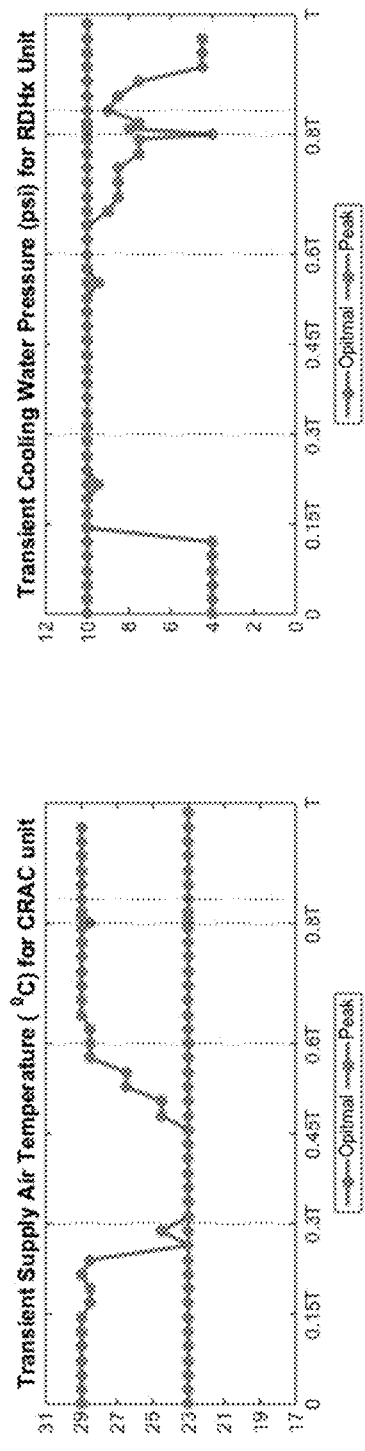
FIG. 3j
FIG. 3k
FIG. 3l

SYSTEMS AND METHODS FOR INTELLIGENT CONTROLS FOR OPTIMAL RESOURCE ALLOCATION FOR DATA CENTER OPERATIONS

CROSS-REFERENCE TO RELATED APPLICATION

This application claims priority to and is a national stage of PCT/US15/018805 filed Mar. 4, 2015, entitled "Systems and Methods for Intelligent Controls for Optimal Resource Allocation for Data Center Operations" which in turns claims priority to the benefit of U.S. Provisional Patent Application No. 61/948,151, filed Mar. 5, 2014, entitled "Systems and Methods for Intelligent Controls for Optimal Resource allocation for Data Center Options" the contents of which are incorporated herein by reference in their entirety.

FIELD

The present application generally relates to operating resource optimization for data centers or mission-critical facilities. In particular, the present application relates to systems and methods for intelligent cooling controls for data centers.

BACKGROUND

Fundamental purpose of data center infrastructure operations is to maintain a reliable computing environment. Generally, data center operating resources are unnecessarily over-provisioned with over-cooled facility rooms and low server utilization profiles. Furthermore, data center operation management protocols typically lack dynamic elasticity as data center operation strategies are designed for a diurnal peak-loads without any provision for the risk-mitigation in an event of dramatic demand surge.

BRIEF SUMMARY

The present disclosure is direct to a data-driven parametric model for rapid assessment of critical data such as CPU junction temperatures and necessary operating set-points for supporting infrastructure such as cooling hardware to optimize energy usage during dynamic events which are often triggered by time-varying computing loads, facility upgrades, and power outages in data centers. A data-driven reduced-order modeling framework is created to improve parametric granularity of critical data for a data center with operating set points such as chiller set point temperature as parameters. An optimal controller that uses the proposed parametric model as the plant is designed. It determines the optimal resource allocation schedule and ensures critical data always remains within a reliability constraint. Therefore, the framework saves operating cost without increasing the risk of service interruption and performance degradation.

In one aspect, the present disclosure is directed to systems and methods for determining optimal operating set points in sync with dynamic demand responsive to time-varying events in a data center. The method includes establishing, by a matrix module executing on a computing device, a data matrix of critical data (e.g. CPU junction temperatures) corresponding to optimal operating set points encompassing the data center duty cycle. The method further includes generating, by a decomposition module executing on the computing device, new critical data point at a new parametric point, different from the parametric points corresponding to the data matrix. Overall, the method is sufficiently efficient to be useful as a real-time predictive tool and that makes the method useful for computing optimal operating set points for data center. A communications module can transmit the set points for the optimal operating resources to a data center management module such as the building management system executing on the computing device. The critical data includes at least one of junction temperatures for central processing units (CPU-s), CPU utilization percentages, rack electrical power draws, server inlet air temperatures, or server exhaust air temperatures. The operating resources largely include electrical power consumed by cooling hardware such as computer room air conditioning (CRAC) units, rear door heat exchangers (RDHx-s), server fans, in-row coolers, chillers, cooling towers, economizers and power delivery systems such as uninterrupted power supply (UPS) units and power distribution units (PDU-s).

In some embodiments, the decomposition module can calculate a parametric mean of the data matrix and calculate a deviation matrix based on the parametric mean. The decomposition module can perform proper orthogonal decomposition (POD) of the deviation matrix to determine the POD modal space and reduce that modal space based on an operator-dependent optimality criterion. Thereafter, the parameter-dependent coefficient matrix is determined by taking tensor product of the pseudo-inverse of reduced basis space and the deviation matrix. Then, the coefficient matrix is statistically combined to yield a new parametric coefficient vector called POD coefficients. In some embodiments, the decomposition module adds the parametric mean with a product of the at least one POD mode and the corresponding parameter-dependent POD coefficients. The prediction module can determine optimal operating set points such as optimal cooling set points by rapidly computing critical data with cooling set points as the parameters until the reliability criterion is satisfied. The adjustment of cooling set point follows certain precedence protocol with the set-point of the lowest-power equipment first exhaustively changed before moving to the higher-power equipment. For example, in some embodiments, both RDHx-s and CRAC-s are used together as a cooling infrastructure. The operating pressure of RDHx is changed first before moving to the CRAC temperature set points. Once the optimal cooling set-points are computed, the communications module can transmit the optimal cooling set points to the building management system. In some embodiments, CPU junction temperatures are used as the reliability data.

BRIEF DESCRIPTION OF THE FIGURES

The foregoing and other objects, aspects, features, and advantages of the invention will become more apparent and better understood by referring to the following description taken in conjunction with the accompanying drawings, in which:

FIGS. 3a-3l, depict graphs of responses of the cooling infrastructure of a data center to different workloads.

Figure 1:
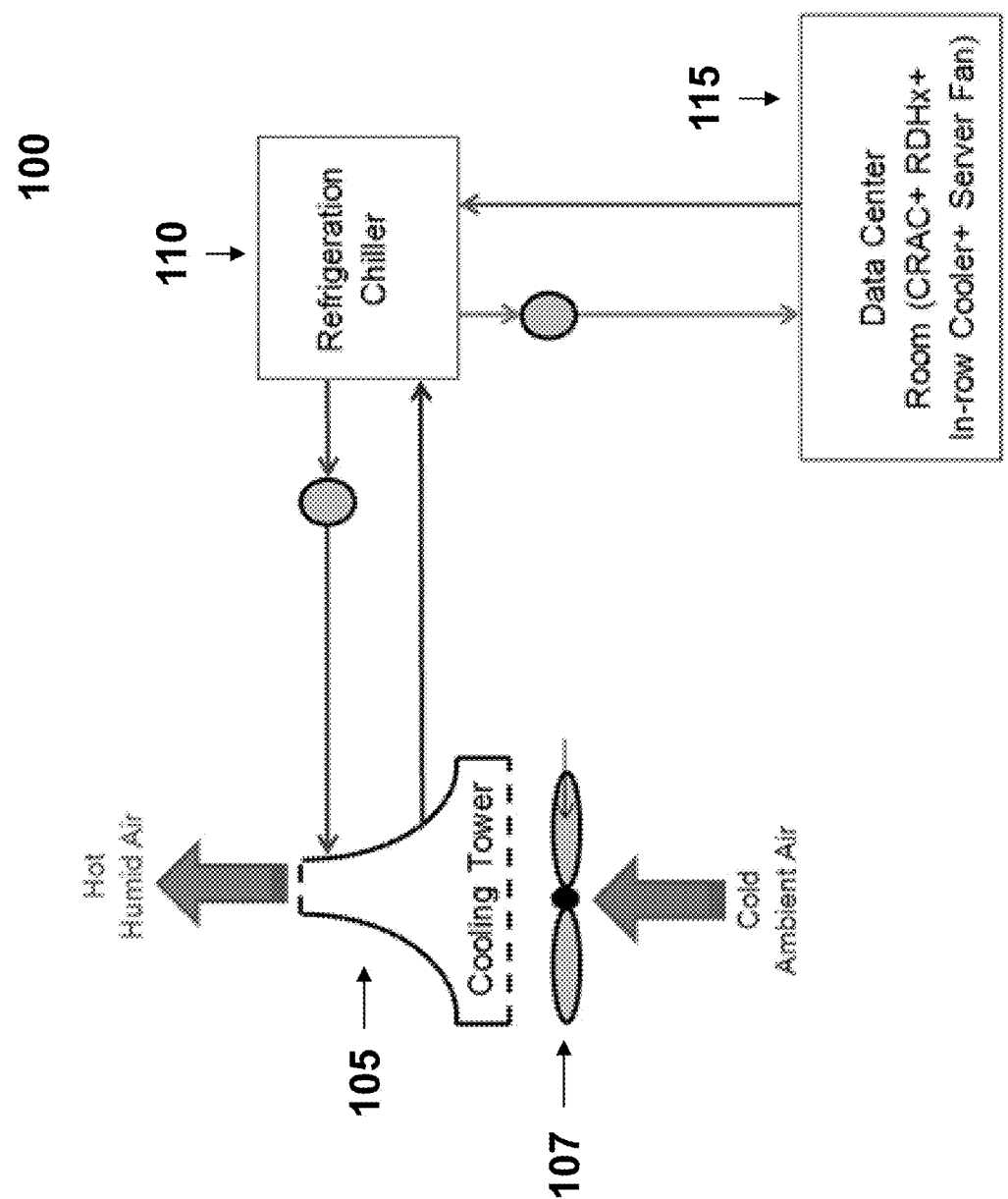
FIG. 1 depicts an embodiment of a cooling ecosystem for a data center.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The present disclosure is directed to systems and methods for intelligent controls for data center operations. In more detail, a mechanism is disclosed herein that efficiently predicts parametric critical data such as CPU junction temperatures with operating set-points such cooling set-points as the parameters. Because the proposed method enables real-time parametric computation of critical data, it is useful as a plant in the optimal controller. In an embodiment, the method includes computing critical data for the most cost-optimal set-points and then evaluating whether the computed critical data satisfies a reliability criterion (e.g., 65° C. when CPU junction temperatures are used as the critical data). If the condition is satisfied, the corresponding optimal set-points are implement by transferring them to the building management system (BMS). Otherwise, the proposed method continues iteratively for next operating set-points until the reliability criterion is met. The transfer sequence to the next operating set-points is based on the energy usage of the pertinent cooling systems. In an embodiment, it is compiled by following precedence rule: first, the set-point for the lowest energy-consuming systems are changed and then, the set-points for the next energy-consuming cooling systems are modified in the order of their energy consumption.

Generally speaking, a data center is a complex cyber-physical system with three major sub-systems: IT racks, power systems, and the cooling infrastructure. The IT racks generally include computing servers, storage devices, and network switches. The power systems generally include transformers, uninterrupted power supply (UPS) units, power distribution units (PDUs), diesel generators, switchgears, and power distribution networks. Finally, the cooling infrastructure generally includes cooling towers, building chillers, chilled-water pumps, air/water side economizers, computer room air condition (CRAC) units (room-level cooling hardware), RDHx (rack-level cooling hardware), and server fans (blade-level cooling hardware).

The fundamental purpose of data center to provide uninterrupted computing services to its clients and for that maintaining a reliable operating environment is critical. One such reliability criterion is to maintain IT component temperature (e.g., processor junction temperature) below a reliability limit by removing waste heat from the facility. A related operating problem is cooling optimization which involves minimizing data center cooling cost without increasing the risk of service interruption and performance degradation from overheating. Any cooling mechanism that can keep IT device temperature below a reliability threshold and within a reasonable operating budget can be a potential solution. In data centers, cooling equipment such as server fans, RDHx-s, and CRAC-units work concurrently to remove waste heat generated in IT devices. Ultimately, the waste heat is rejected into the atmosphere by building chillers, cooling towers, and economizers. On average, this cooling infrastructure ingests about 40-50% of the electricity consumption in a typical data center. The power consumptions for these cooling hardware are controlled by their respective set-points, e.g. the supply air temperature for a CRAC unit and the driving pressure for cooling water for an RDHx. Therefore, the optimizations of these set-points are tantamount to the optimization of the cooling cost.

However, due to lack of interoperability between IT operations and cooling controls, data centers typically operate over-provisionally with over-cooled facility rooms and low server utilization profiles. Data center cooling management systems—mostly controlled by the building management systems (BMS-s)—are typically designed for a diurnal peak-load without any provision for elastically modulating for dynamic cooling demand and for the risk-mitigation in an event of dramatic demand surge, for example, during flash-crowd events such as a new product launch. Therefore, the state-of-the-art cooling waste significant operating resources. On the other hand, under-provisioned cooling can cause significant headache for data center operators in form of poor service quality or at the worst service interruption.

FIG. 1 depicts an embodiment of a cooling ecosystem 100 for a typical data center. The cooling ecosystem 100 includes a cooling tower 105, a refrigeration chiller 110, and a data center room 115, including CRAC units, RDHx units, in-row coolers, and server fans. In brief overview, the cooling ecosystem filters cold air and water through the different components of the cooling infrastructure and extracts waste heat to cool and maintain temperature and humidity in the data center room. Typically, data center rooms remove the waste heat to the building chiller(s) which in turn dispose it the atmosphere via the cooling tower(s). In some embodiments, as illustrated in FIG. 1, the various components of the cooling infrastructure often operate simultaneously. The set-points of each of the different components of the cooling infrastructure can be controlled to provide a holistic cooling energy management for data centers as will be described in greater detail below. In some embodiments, such an approach can dictate extracting maximum capacity from a low-power equipment (e.g. rear door heat exchanger (RDHx)) before moving to high-power equipment (e.g. computer room air conditioning (CRAC) unit).

Figure 2:
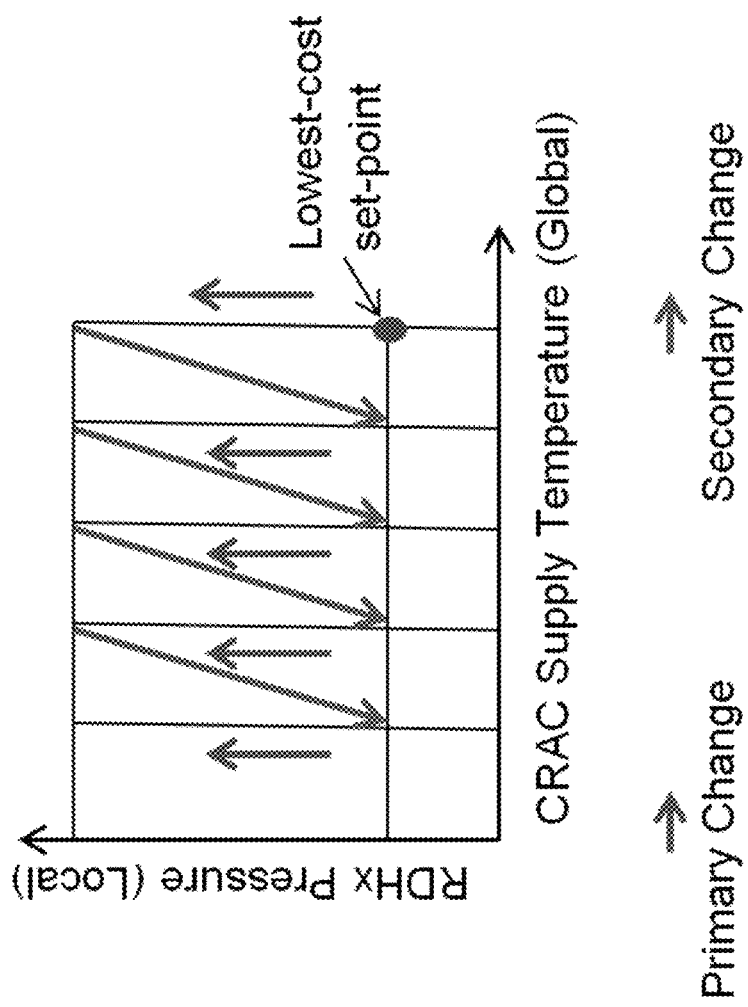
FIG. 2 depicts an embodiment of the cooling set-points adjustment protocol with RDHx cooling water pressure and CRAC supply air temperature as the representative set-points

For example, and now referring to FIG. 2, an embodiment of the transfer protocol 200 for the change precedence for cooling set-points. As shown in FIG. 2, the RDHx pressure is designated as the primary variable and the CRAC supply temperature as the secondary variable to be changed. The choice is dictated by the fact that RDHx is a low-power unit, approximately 18 kW, while CRAC's power rating can be approximately 150 kW. In an embodiment, energy efficient operation dictates that any dynamic event should be initially negotiated by a low-power unit (e.g. RDHx) followed by a high-power CRAC unit (e.g. CRAC).

For example, FIGS. 3a-3i, display graphs of responses of the cooling infrastructure of a data center to different workloads. FIG. 3a shows the transient IT utilization profile for high performance computing (HPC) workloads for a data center. In FIG. 3a, at 0.1 T, a rapid surge in the workload occurs causing a spike in the IT utilization profile and that continues till 1 T. Here T is a representative operational time period. FIG. 3b shows the response of the CRAC supply temperature to the IT utilization profile as shown in FIG. 3a. In more detail, FIG. 3b compares the comparison of dynamically modulated CRAC supply temperature set-points to the corresponding peak-provisioned value. FIG. 3c shows a graph of a response of the RDHX pressure to the IT utilization profile as shown in FIG. 3a. In more detail, FIG. 3c compares the comparison of dynamically modulated RDHx pressure set-points to the corresponding peak-provisioned value. In FIGS. 3b and 3c, between 0.1 T-1 T, the CRAC supply temperature drops, while the RDHx pressure sharply goes up in that period from to negotiate with sudden rise in the cooling demand. The controller is designed such that the set-points for the low-power cooling equipment, RDHx pressure, responds first followed by the set-point change of the higher-power equipment, CRAC.

FIG. 3d shows the transient IT utilization profile for enterprise workloads for a data center. In FIG. 3d, at 0.6T, the workload slowly declines causing a dip in the IT utilization profile. FIG. 3e shows the response of the CRAC supply temperature to the IT utilization profile as shown in FIG. 3d. In more detail, FIG. 3e compares the comparison of dynamically modulated CRAC supply temperature set-points to the corresponding peak-provisioned value. FIG. 3f shows a graph of a response of the RDHX pressure to the IT utilization profile as shown in FIG. 3d. In more detail, FIG. 3f compares the comparison of dynamically modulated RDHx pressure set-points to the corresponding peak-provisioned value. In FIGS. 3e and 3f, between 0.6 T-1 T, the CRAC supply temperature remains relatively level. On the other hand, RDHx pressure sharply declines at 0.6 T to negotiate the decrease in cooling demand. The controller is designed such that the set-points for the low-power cooling equipment, RDHx pressure, responds first followed by the set-point change of the higher-power equipment, CRAC.

FIG. 3g shows the transient IT utilization profile for batch workloads for a data center. In FIG. 3g, at 0.2 T and 0.6 T, a surge in the workload occurs causing a spike in the IT utilization profile. Each event lasts about 0.2 T. FIG. 3h shows the response of the CRAC supply temperature to the IT utilization profile as shown in FIG. 3g. In more detail, FIG. 3h compares the comparison of dynamically modulated CRAC supply temperature set-points to the corresponding peak-provisioned value. FIG. 3i shows a graph of a response of the RDHX pressure to the IT utilization profile as shown in FIG. 3g. In more detail, FIG. 3i compares the comparison of dynamically modulated RDHx pressure set-points to the corresponding peak-provisioned value. In FIGS. 3h and 3i, between 0.2 T-0.4 T and between 0.6 T-0.8 T, the RDHx pressure increases close to peak levels to handle the sudden rise in the cooling demand. While, the CRAC supply temperature drops to handle the sudden rise in the cooling demand, but does not reach peak levels. The controller takes advantage of the set-points for the low-power cooling equipment, RDHx pressure, first and then uses the set-point change of the higher-power equipment, CRAC.

Additionally, FIGS. 3j-3l, display graphs of responses of the cooling infrastructure of a data center to a cloud computing workload, comprising gradual variation of IT utilization together with a rapid surge in the workload. FIG. 3j shows the transient IT utilization profile for a data center. In FIG. 3j, at 0.8 T, a rapid surge in the workload such as a flash crowd event occurs causing a spike in the IT utilization profile. The flash event lasts from 0.8 T to 0.84 T. FIG. 3k shows the response of the CRAC supply temperature to the IT utilization profile as shown in FIG. 3j. In more detail, FIG. 3k compares the comparison of dynamically modulated CRAC supply temperature set-points to the corresponding peak-provisioned value. FIG. 3l shows a graph of a response of the RDHX pressure to the IT utilization profile as shown in FIG. 3j. In more detail, FIG. 3l compares the comparison of dynamically modulated RDHx pressure set-points to the corresponding peak-provisioned value. Further, in FIGS. 3k and 3l, between 0.8 T-0.84 T, the CRAC supply temperature varies marginally with a small response initially. On the other hand, RDHx pressure sharply goes up in that period from 0.8 T to 0.84 T to negotiate with sudden rise in the cooling demand. The controller is designed such that the set-points for the low-power cooling equipment, RDHx pressure, responds first followed by the set-point change of the higher-power equipment, CRAC. In contrast, simply using peak-provisioned values for CRAC and RDHx set-points are significantly wasteful.

Figure 4:
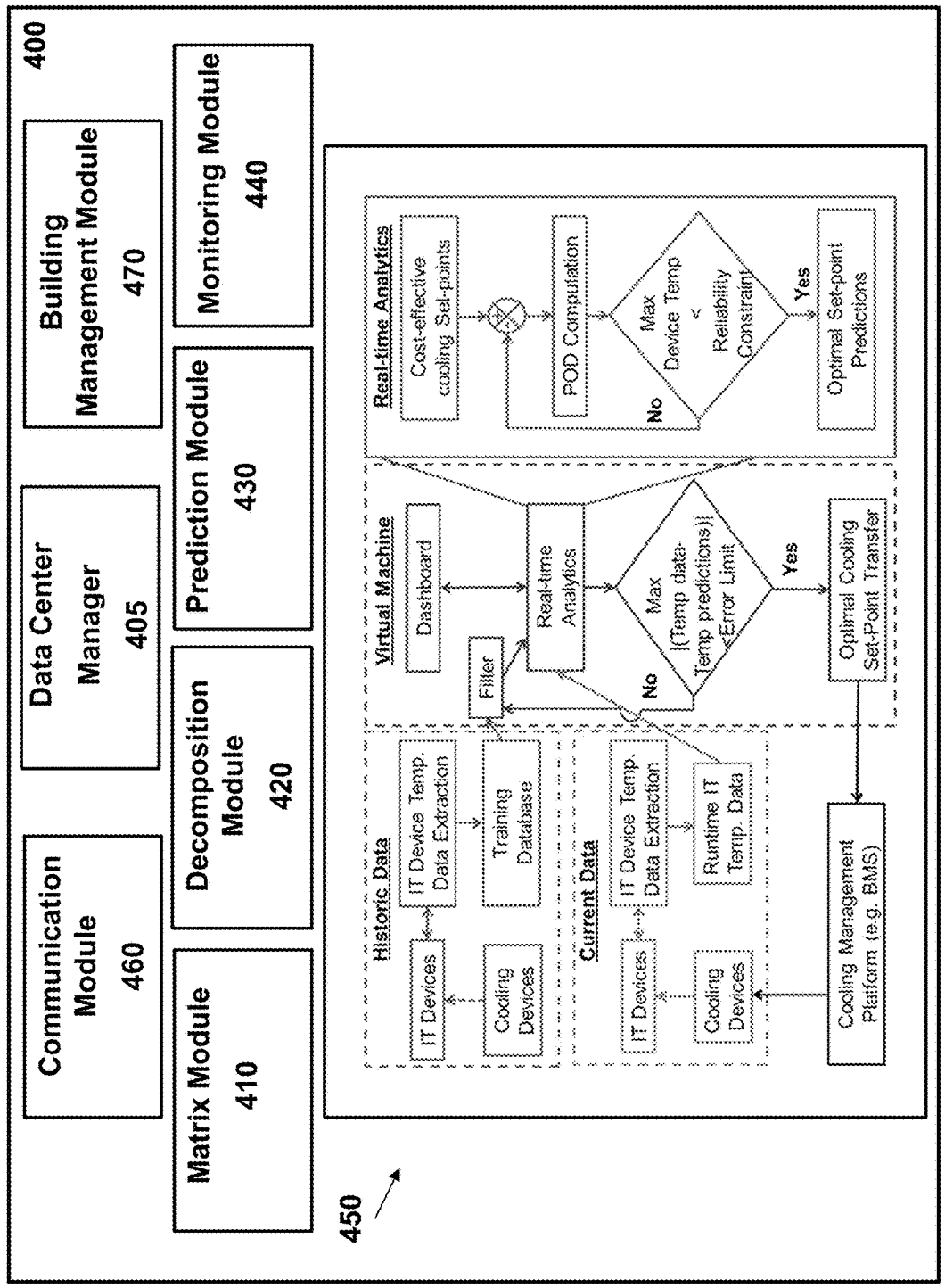
FIG. 4 depicts an embodiment of a block diagram of a system for optimizing cooling set points in a data center.

Now referring to FIG. 4, which depicts a block diagram of the optimal cooling system 400 for a data center. The system 400 includes a data center manager 405, a matrix module 410, a decomposition module 420, a prediction module 430, a monitoring module 440, an appliance 450, a communication module 460, and a building management module 470. In an embodiment, the system 400 is configured to store a database of historic training data, compute cost-optimal cooling set-points with changing IT workloads in real-time, and automatically implement the optimal cooling set-points by communicating them to the building management system or localized cooling control units. An optional IT data feed can be included as an accuracy tracking mechanism. In some embodiments, the building management module 470 is executing on a computing system or hardware remote from the cooling system 400. For example, the building management module 470 may be executing on a building management system (BMS) for a data center. The building management module 470 can be communicatively coupled to the cooling system 400 through the communication module 460 to receive optimal cooling point settings to be implemented in a corresponding data center.

The data center manager 405 can utilize any of the matrix module 410, the decomposition module 420, the prediction module 430, the monitoring module 440, the communications module 460, and the building management module 470 to perform the prediction of the critical data and the optimization of cooling set points for cooling hardware in a data center as described herein. In some embodiments, the modules (e.g., the matrix module 410, the decomposition module 420, the prediction module 430, the monitoring module 440, and the communications module 460) are implemented as processor-executable software modules which may reside on a computer-readable medium of the appliance 450. In some embodiments, the modules are implemented in an interconnected combination of hardware and software. The modules may be packaged, combined, designed or constructed in a form of the virtualized appliance delivery controller deployable as one or more software modules or components executable in a virtualized environment or non-virtualized environment on any server, such as an off the shelf server. Each of the modules may be designed and constructed as a software component or module to run on any operating system of a computing device (appliance 450) and/or of a virtualized environment. The modules can be configured to perform each of the functions, procedures, or methods as described herein.

In some embodiments, the appliance 450 may include a computing environment for executing an application that uses or processes a data file as described herein. The appliance 450 be deployed as and/or executed on any type and form of computing device, such as a computer, tablet computing device, handheld computing device, mobile computing device, network device, or appliance capable of communicating on any type and form of network and performing the operations described herein. The appliance 450 may include a central processing unit and a main memory unit. In some embodiments, the data center manager 405 is communicatively coupled to the appliance 450 to perform any of the methods described herein or to retrieve or store data. The appliance 450 may include additional optional elements, such as one or more input/output devices and a cache memory in communication with the central processing unit.

In some embodiments, the appliance 450 includes a historical data module, a current data module, an enabling virtual machine for real-time analytics, and a communication bridge between the virtual machine and a building management system. The inclusion of the current data module is strongly dependent on data center security policy and end-user choice. The historical data module may store data from IT devices in the data center, cooling devices for the data center, a training database for machine learning-based real-time analytics, and data for IT device temperature extraction. The current data module may handle near real-time or real-time data acquisition from IT devices in the data center, cooling devices for the data center, a training database, and data for IT device temperature extraction. The virtual machine may be any form of virtual computing device executing on the appliance 450 to provide a computing environment to the appliance 450 or to a user of the appliance 450. In some embodiments, the virtual machine includes a dashboard to provide feedback and user interfaces to a user to interact with the appliance 450 and the system 400. The virtual machine includes the POD-based decomposition module, data prediction module, and data monitoring dashboard capability. The matrix module and the integrative capability with the BMS system can be added as plug-ins.

As illustrated in FIG. 4, the cooling system 400 is configured to retrieve and handle data center cooling optimization problems and provide optimal cooling set points for devices in the data center. For example, the cooling system 400 can use the communications module 460 to provide optimal cooling set points to the building management module 470 of a building management system. The central piece of the appliance 450 is the machine learning-based real-time predictive analytics framework. In an embodiment, the framework is fed by an IT device temperature data extraction system that communicates to multi-protocol (e.g. SNMP, IPMI)-based data center network. The IT device temperature data for different types of computing workloads and parametric cooling set-points can be extracted a priori and contained in a training database. Then if recommended current data module is included, the training database can be filtered based on workload if the absolute deviation between prediction data and run-time IT device temperature data would fail to satisfy certain pre-assigned error criteria. Clearly, the current data module improves the prediction fidelity and efficiency. The filtered/unfiltered training data can then be analyzed by the machine learning-based real-time predictive framework to compute the optimal cooling set-points. The predictive framework for optimal cooling set-points computation is based on a proper orthogonal decomposition (POD)-based iterative method. As shown in FIG. 4, the predictive analytics starts by determining IT device temperature data for the most cost-efficient cooling set-points, and then it assesses whether a reliability constraint is satisfied. The choice of the reliability constraint can be dictated by data center tier status and operating ranges of IT/cooling equipment involved. If the reliability constraint is not satisfied, then an iterative procedure that transfers the computation to the next cost-effective cooling set-points is invoked. The iterative procedure continues until the reliability criteria is satisfied. The computed optimal cooling set-points are transferred to the cooling devices by the installed cooling network drivers (e.g. BACnet driver) and management platforms (e.g. BMS) to automatically implement optimal cooling. With the data-driven method, the framework is flexible enough to accommodate various types of IT devices, cooling equipment, and communications protocols (e.g. BACnet, Modbus). The key challenges addressed pertain to meeting the stochastic cooling demand from the training database and rapidly setting up the optimal cooling set-points to maintain the data center operational environment.

The methods and systems described herein can compute cost-optimal cooling set-points with changing IT workloads in real-time and automatically implement the optimal cooling set-points by communicating them to the corresponding cooling hardware. As described herein, in one embodiment, workload-proportional cooling is used, which can be defined as the cooling in sync with changes in IT workload. Most data centers assess cooling need based on air temperature at:

server inlets (e.g., 15% of data centers), cooling hardware return sides (e.g., 30%), cooling hardware supply sides (e.g., 28%), and data room (e.g., 27%).

As these locations are far away from the heat sources (e.g. CPU-s) and often strongly influenced by the convective airflow, and therefore, the corresponding temperatures do not accurately anticipate the cooling demand. To reduce the overall cooling cost, it is important to ensure coordinated optimization across various cooling hardware. The approach of minimizing energy usage for single cooling equipment might cause overall rise in the energy expenditure. For example, the CRAC unit operating at a higher temperature set-point can consumes less power; however, that would lead to higher server inlet temperatures and consequently trigger higher CPU leakage power and server fan power. Therefore, it is of paramount importance to compute optimal cooling set-points using all the interacting cooling equipment as an interconnected system.

In some embodiments, a reduced-order heat transfer modeling framework can be generated using a proper orthogonal decomposition (POD) to predict optimal cooling set points for a data center. The POD, also widely known as principal component analysis (PCA), is a data compression method that transforms a data matrix into a product of a low-rank matrix (POD modes) and a coefficient matrix (POD coefficients). POD-based data compression methods have been used in many industries including video surveillance, face recognition, and bio-informatics. The POD can be used as a parametric optimization tool to model a data center infrastructure and can use parameters such as rack heat load, CRAC flow rate, and time. In an embodiment, POD is an effective tool to determine that k-dimensional subspace. A decomposition of any arbitrary matrix, $A=\sum_{i=1}^{n}\sigma_i U_i V_i^T$ is called the proper orthogonal decomposition if the sequence of $\sigma_i$, is non-increasing, and the sets of $\{U_i\}$, $\{V_i\}$ are orthonormal.

Figure 5:
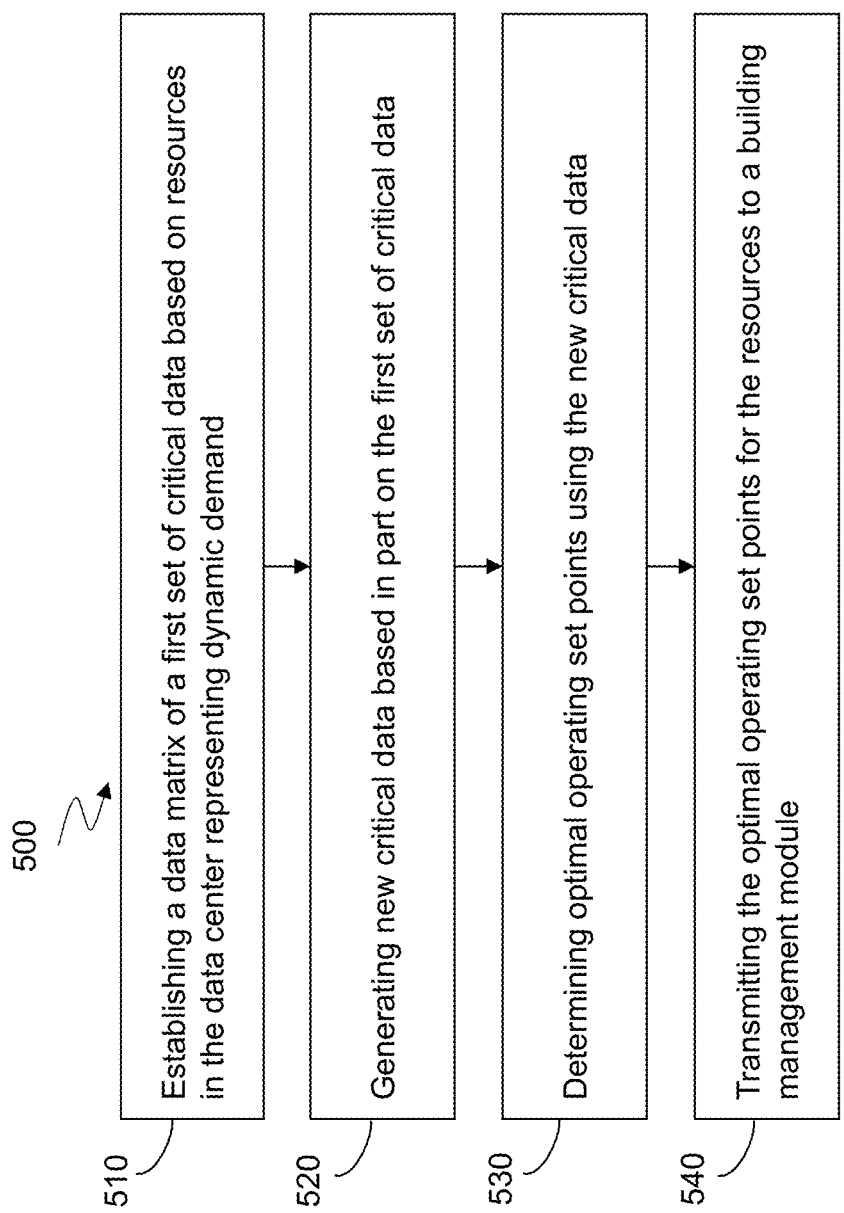
FIG. 5 depicts an embodiment of a machine learning based algorithm for computing high-fidelity critical data efficiently.

Now referring to FIG. 5, which depicts a flow diagram of a method 500 for determining optimal operating set points in sync with dynamic demand responsive to time-varying events in a data center. In brief overview, at step 510, the method includes establishing, by a matrix module executing on a computing device, a data matrix of a first set of critical data based on resources in the data center representing dynamic demand. The dynamic demand responsive to the time-varying events in the data center. At step 520, the method further includes generating, by a decomposition module executing on the computing device, new critical data based in part of the first set of critical data. At step 530, the method further includes determining, by the prediction module executing on the computing device, optimal operating set points using the new critical data. At step 540, the method further includes transmitting, by a communication module executing on the computing device, the optimal operating set points for the resources to a building management module.

With the advent of cloud computing, the mismatch between computing load-induced operating resource demand such as cooling and actual resource supply is reducing data center energy efficiency significantly. The major operating/cooling design problem for a data center is its virtualized computing resources. Virtualization is creation of virtual machines that act like a real computing platform within an operating system. This application is virtual in the sense that it can be migrated rapidly to different computing nodes co-located within the same facility or located outside the facility.

Figure 6:
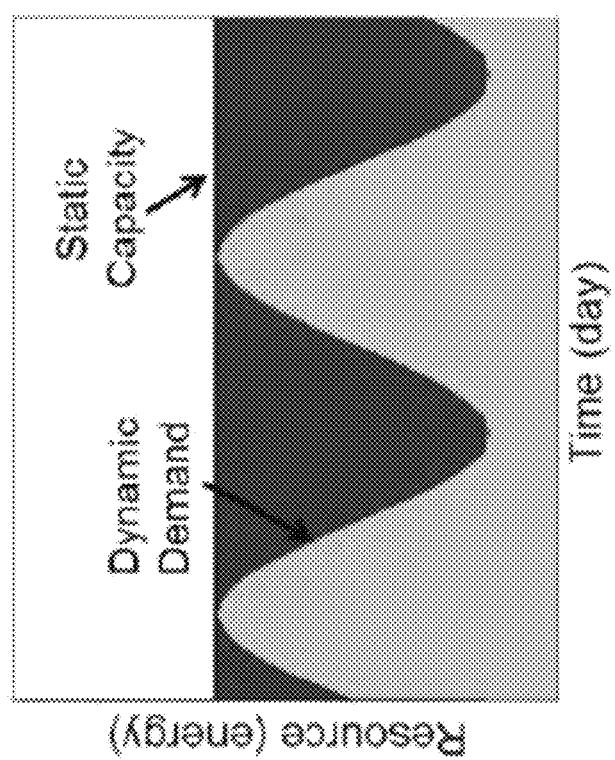
FIG. 6 displays an embodiment of a graph of cooling demand versus supply.

For most embodiments of data centers, cooling represents the critical operating variable. Due the stochastic nature of the demand, the computing load on a data center and the associated heat load can vary randomly. However, the lack of a demand-aware cooling allocation framework can cause a facility to operate at the most conservative set-points. That amounts to significant cooling over-provisioning, as illustrated in FIG. 6, which displays a graph of cooling demand versus supply in terms of resource (energy) and time. In more detail, FIG. 6 illustrates the mismatch of cooling demand as compared to a static cooling supply. To avoid this wasteful cooling operation, the cooling supply curve needs to be dynamic and elastic. That is equivalent to improving the cooling response time, which is a combination of controller feedback response time and cooling hardware latency. In some embodiments, the present disclosure is directed to methods and systems for rapidly and accurately predicting CPU junction temperatures for different cooling parametric set-points. The CPU junction temperature is a critical decision-making parameter because most of the key thermal management protocols inside a server are based on CPU junction temperatures.

In further detail, at step 510, a data matrix is established that includes a first set of critical data. The critical data can be based on cooling resources, data center traffic, electrical power draw of devices in a data center, and server utilization. For example, in one embodiment, the critical data is temperature data with cooling resource set-points used as the parameters. In some embodiments, the dynamic cooling demand is responsive to the time-varying events in the data center, such as varying IT workloads. The critical data could include at least one of CPU junction temperatures, CPU utilization percentages, electrical power draw, server inlet air temperatures, or server exhaust air temperatures. For example, the data matrix can include junction temperatures of CPU-s measured by on board thermal diodes with parametric space, including CRAC supply air temperature set-points and RDHx cooling water pressure set-points. The temperature data can be calculated based on properties of the cooling resources being utilized by the data center. The cooling resources can include electricity consumed by any type of cooling mechanism or device used in a data center, such as a CRAC unit or a RDHx assembly. In some embodiments, cooling resource values are used to establish initial cooling set points to determine the critical data, such as a CRAC supply air temperature or a RDHx assembly cooling water pressure. In some embodiments, the data matrix is established for temperatures of other IT components such as a memory bay. The data matrix can also include temperature values for any other critical IT devices in the data center. The parametric space may be composed of set-points of other cooling devices such as chiller or cooling towers.

$$T_i = f(x,y,z; \text{workload}, t, T^{CRAC,supply}, P^{RDHx})$$

In an embodiment and as will be discussed in greater detail below, the cooling resource properties can be adjusted in order for the critical temperature data to meet or stay below a reliability or critical threshold value.

At step 520, the method further includes generating, by a decomposition module executing on the computing device, the critical data for a new parametric point based on at least one POD mode for the data matrix and corresponding POD coefficients. The new or second set of critical data can be representative of the parametric space of data values. To generate the critical data for the new parametric point (e.g., second set of critical data), a parametric mean of the data matrix is calculated. Next, a deviation matrix can be calculated by subtracting the parametric mean from the data matrix. In some embodiments, the method further includes applying POD-based decomposition of the deviation matrix to determine POD modes. The decomposition module can reduce the modal space based on the user-specified accuracy criterion. Higher prediction fidelity demands inclusion of more POD modes, which in turn increases the computational time.

In some embodiments, the decomposition module determines weighing coefficients corresponding to a basis function space for the critical data. For example, POD coefficients can be determined using parametric numerical analysis. In some embodiments, the decomposition module determines a coefficient matrix by taking the tensor product of pseudo inverse of reduced POD modes and the critical data matrix. The POD coefficient for the new parametric point calculated by interpolating the coefficient matrix. With knowledge of the reduced POD modal space, optimal basis function space, and the corresponding POD coefficients, the decomposition module can add the parametric mean with a product of the reduced POD modal space (e.g., optimal basis function) and the parameter-dependent POD coefficients (e.g., weighing coefficients) to determine new critical data.

At step 530, the method further includes determining, by the prediction module executing on the computing device, optimal operating set points using the new critical data. In some embodiments, the operating set points are cooling set points for the cooling resources in the data center and can be based on the second set of critical temperature data. The prediction module can iteratively determine cooling set points until an operational fidelity criteria is met, such as a reliability criteria or critical threshold on the maximum CPU junction temperature. The prediction module can continuously predict and determine new cooling set points until optimal or cost-optimal cooling set points are determined. In some embodiments, the prediction module predicts temperatures for CPU locations based on the at least one POD mode and the POD coefficients. The prediction module can predict an interrogation point temperature for the interrogation location in the data center based on the at least one POD mode and the POD coefficients. Optimal cooling set points may refer to cooling set points which cause air or IT component temperatures in a data center to meet an operational fidelity criteria, such as a reliability criteria or critical threshold In some embodiments, the prediction module compares the operating set points to a critical threshold value. In some embodiments, to determine if operating set points are optimal, the prediction module can compare the operating set points to a critical threshold value. The prediction module evaluates whether the operating set points cause air or IT component temperatures in the data center to satisfy a reliability criteria (e.g., 32° C. for air, 65° C. for CPU). In one embodiment, if the initial cooling set points cause the air or IT component temperatures in the data center to satisfy a reliability criteria, the initial set points are deemed to be optimal. For example, the prediction module can determine that at least one of a junction temperature for a CPU or a CPU utilization value is below a reliability limit.

The reliability criteria and critical threshold can be determined based on various factors such as the equipment in the data center, the equipment manufactures' ratings, and industry standards or best practices. When the cooling set points are greater than the reliability criteria or critical threshold, the values for the cooling resources can be adjusted by the prediction module. The prediction module can follow and adjustment protocol in which lower power cooling resources are adjusted before high power cooling resources are adjusted.

In some embodiments, the prediction module decreases a cooling resource value, such as the CRAC supply air temperature or the RDHx assembly cooling water pressure. In other embodiments, the prediction module increases a cooling resource value. In some embodiments, the prediction module can increase one cooling resource value and decrease a second cooling resource value. For example, the prediction module can decrease the CRAC supply air temperature by some pre-assigned value such as 0.5° C. and increase the RDHx assembly cooling water pressure by some pre-assigned value such as 0.5 psi. These pre-assigned values are dictated by the computational efficiency requirement. Higher resolution change means more computational time. The prediction module can continuously modify and adjust the cooling set points until it determines that cooling set points are optimal cooling set points in response to the comparison to the critical threshold value.

At step 540, the method further includes transmitting, by a communication module executing on the computing device, the operation set points to a building management module. For example, the communications module can transmit cooling set points for the cooling resources to the building management module. The building management module can be executing on the same computing device as each of the matrix module, decomposition module, prediction module, and communication module. In other embodiments, the building management module is executing on a remote computing device, remote from each of the matrix module, decomposition module, prediction module. The building management module can be, communicatively coupled to each of the matrix module, decomposition module, prediction module, and communication module. executing on the computing device. In some embodiments, the communication module transmits the optimal cooling set points to the building management module. The building management module can be a building management system for running and maintaining a data center. In some embodiments, the building management module is integrated with the prediction module and communications module to continuously receive updates and information to maintain air or IT component temperatures in the data center (e.g., CPU junction temperatures) below a reliability threshold and ensure a reliable computing environment and cost-efficient cooling mechanism. The systems may operate as a continuous feedback loop to verify that temperatures are staying below the reliability threshold.

Figure 7:
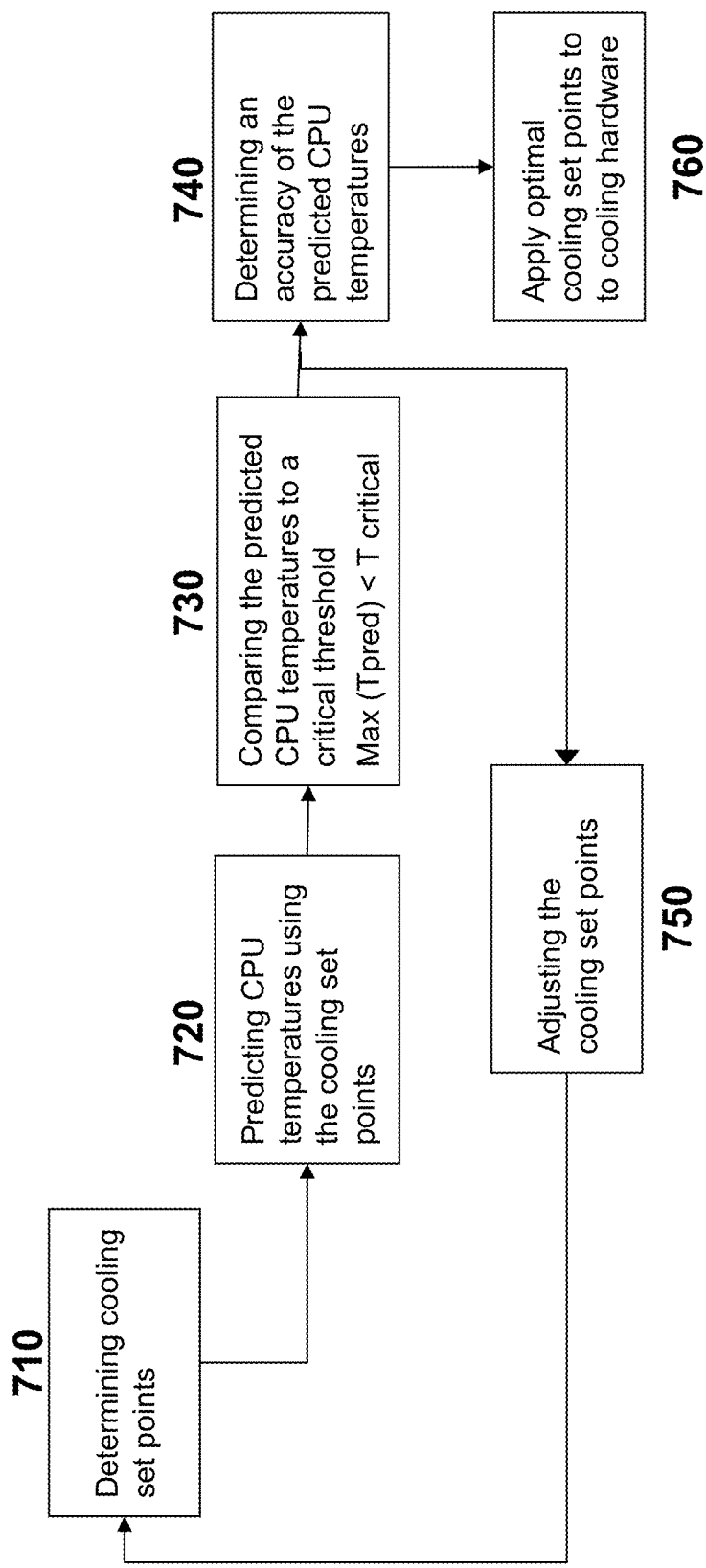
FIG. 7 depicts an embodiment of a flow diagram of the optimal controller for determining demand-proportional cooling set-points

Now referring to FIG. 7, a flow diagram of a method 700 for determining and implementing optimal cooling set points is illustrated. In some embodiments, the method 700 is a real-time control loop for optimal cooling resource set-point determination by a POD-based method. The controller can be based on junction temperatures for CPUs, server inlet air temperatures, or server exhaust air temperatures. If the controller is based on junction temperatures for CPUs, then the POD-based framework with junction temperatures for the CPUs as the response variable can be used as a state-space generator. On the other hand, if the controller is based on server inlet/exhaust air temperatures, POD-based framework with server inlet/exhaust air temperatures as the response variables can be used. The feedback temperature measurement is facilitated by POD method that uses time and spatial locations as parameters. A parametric framework in time improves temporal resolution of measured data, thereby it facilitates down-sampling of transient temperature measurements. That means data acquisition in the feedback system can be done by low-grade inexpensive thermal sensors. On the other hand, a data-driven framework with spatial locations as parameters improves spatial resolution of measured temperature data. Thereby, it reduces sensor requisition for feedback temperature data acquisition.

In some embodiments, an optimal cooling environment for a time-varying workload profile is determined and the cooling set points can be used for the optimal cooling environment in response to the time-varying workload profile. For example, in one embodiment, the optimal cooling design problem can be formulated as:

$$\begin{cases} \text{Maximize } T_{Sup} \\ \text{Minimize } \Delta P_{RDHx} \\ \text{Constraint max}(T_{CPU}) < 65°C. \end{cases}$$

The optimal cooling design may provide a cost-efficient data center operation because the maximization of CRAC supply temperature under the given constraint amounts to optimizing a chiller flow rate. In some embodiments, the minimization of rear door heat exchanger cooling water driving pressure under the given constraint can optimizes the building chilled water pump work.

The proposed real-time CPU temperature computation method can be used iteratively to allocate optimal cooling resources for data centers. At step 710, the most cost-effective cooling set points are chosen as the starting point in the iterative procedure. Besides cost considerations, the starting cooling resource set-point are determined by several factors, including the class of a data center and cooling hardware operational ratings (such as allowable set-points for RDHx). At step 720, the CPU temperatures can be calculated using the initial cooling set points, for example, using method 500 as described above with respect to FIG. 5. At step 730, the maximum CPU temperature is compared with a critical CPU temperature. The critical CPU temperature indicates a temperature that a maximum CPU temperature should not be greater than for reliable data center operation. For example in one embodiment a critical CPU temperature of 65° C. is be established. At step 740, the accuracy of CPU temperature predictions is examined by comparing it with the real-time data. If a maximum CPU temperature is below or equal to the critical CPU temperature of 65° C. and the fidelity criterion at step 760 is satisfied, then the initial operating point is the optimal point. At step 760, the initial cooling set points are applied to the cooling hardware in the data center by communicating with the building management system. If the maximum CPU temperature is above the critical CPU temperature of 65° C., at step 750, the cooling set points are adjusted based on the protocol discussed in reference to FIG. 2 and CPU temperatures are iteratively recomputed until maximum CPU temperature goes below the critical CPU temperature.

In some embodiments, a monitoring module monitors device temperatures in the data center. The monitoring may occur in real-time or near real-time and be continuous during operation of a data center. In some embodiments, the monitoring occurs at predetermined points in a data center duty cycle, such as based on workload variations (e.g., peak cycles) or based on time of day. For example, the monitoring module may detect a workload change in the data center. Responsive to the workload change, the prediction module may adjust the CRAC supply temperature and the heat exchanger pressure. In some embodiments, the heat exchanger pressure is adjusted prior to adjusting the supply temperature. The CRAC unit can be more energy-intensive compared to an RDHx unit. In light of that fact, an energy-efficient cooling infrastructure design for a given test rack can provide the first-level of cooling from the corresponding RDHx unit. The CRAC supply temperature can be modulated when RDHx unit pressure has been pushed to a maximum level. In some embodiments, the RDHx pressure is used as the inner variable and CRAC supply temperature as the outer variable in the iterative optimization loop. In some embodiments, the prediction module determines a second set of cooling set points responsive to the workload change or the adjusted the supply temperature and the heat exchanger pressure.

Figure 8:
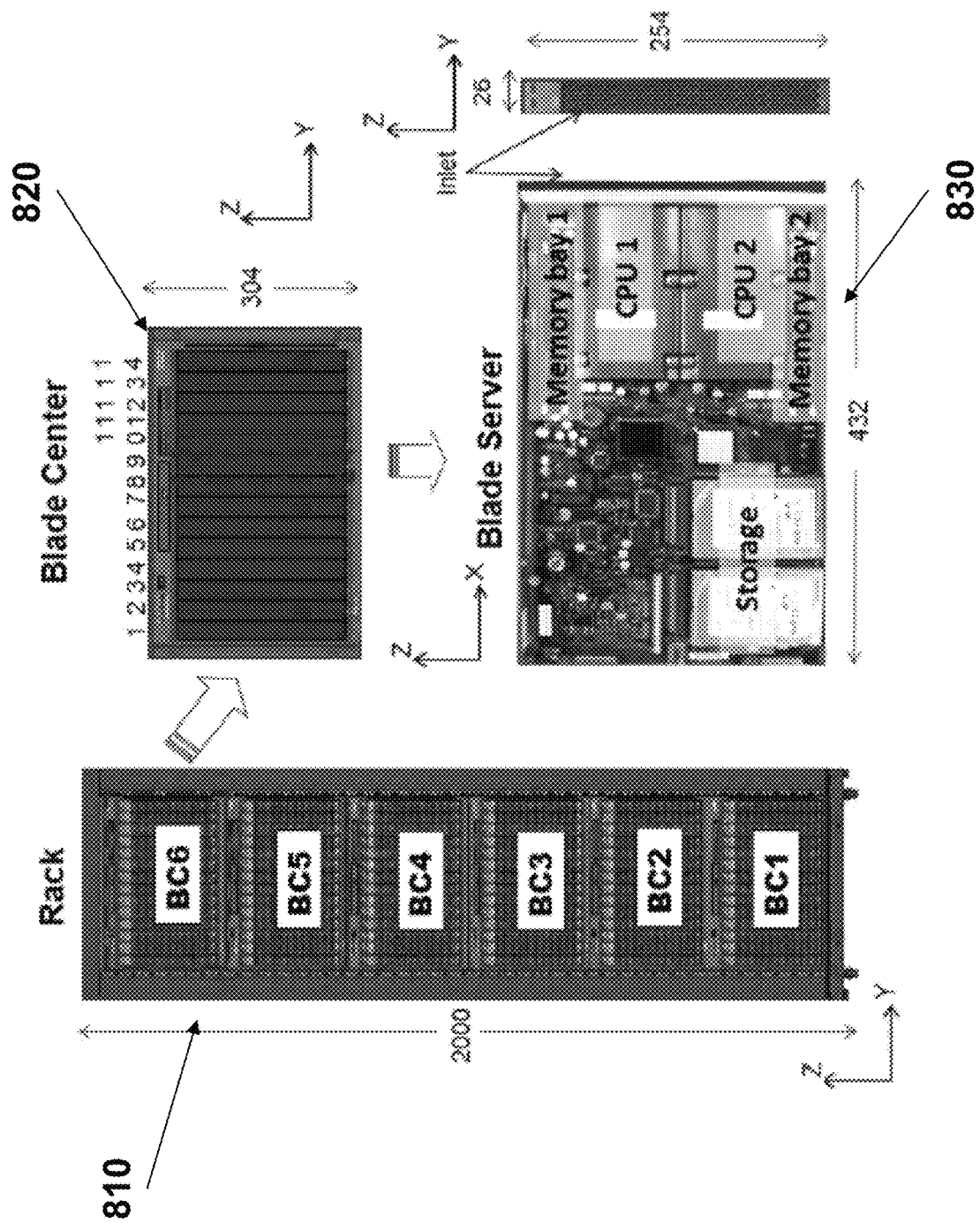
FIG. 8 depicts an embodiment of an illustration of components of a blade center rack.

In some embodiments, the data matrix is established using critical temperature data for cooling resources in the data center based on a level of a rack server. For example, and as illustrated in FIG. 8, an individual rack server in a data center can be divided into at least three tiers, a rack-level 810, a blade center level 820, and a CPU level 830. In some embodiments, the data matrix is established based on a level of a rack server. For example, an individual rack server in a data center can be divided into at least three tiers, a rack-level, a blade center level, and a CPU level. A data matrix can be established for temperatures for each level. In some embodiments, the data matrixes are established in a pre-defined order. The rack-level data matrix can be established first, the blade center level can be established second, and the CPU level can be established third. For example, in one embodiment, a rack include may include 6 blade centers, each blade center may include 14 blades, and each blade (e.g., CPU level) may include 2 CPU's. The rack level data matrix can include temperature data for all CPU's in an entire rack. The blade center level data matrix can include temperature data for all CPU's in a blade center (e.g., all CPU's for each of the blades in the respective blade center). The CPU level data matrix can include temperature data for all CPU's in a specific blade.

Figure 9:
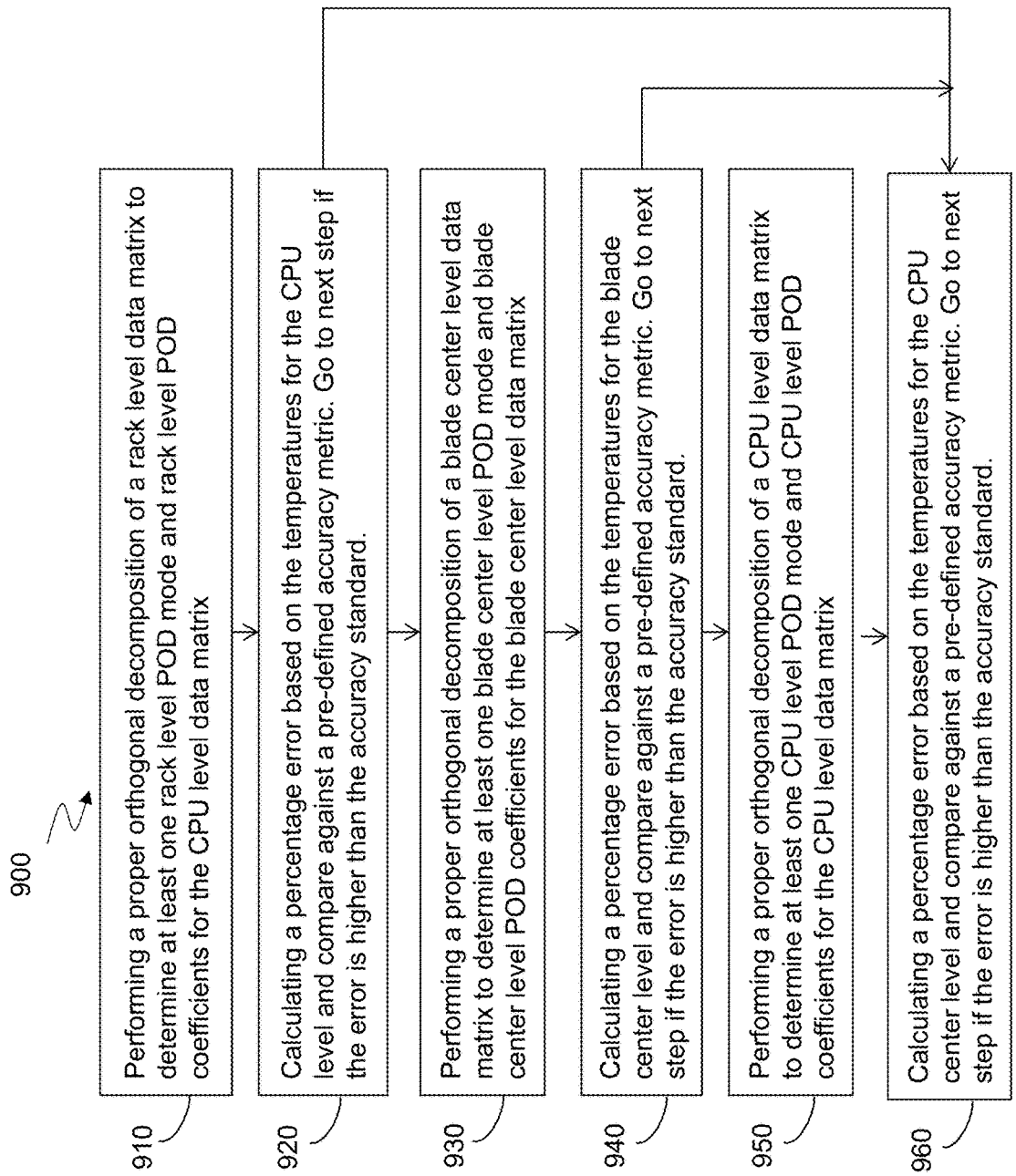
FIG. 9 depicts an embodiment of a flow diagram of a three tiered method for determining optimal cooling set points is illustrated.

In some embodiments, the optimal cooling set points for the data center can be determined based on the data matrices of different sizes corresponding to different length scales of the equipment. For example, FIG. 9 depicts an embodiment of a flow diagram of a method 900 for determining cooling set points in a data center. It is essentially a three-tier procedure consistent with the fact that the critical data are compiled for a IBM blade center rack (as shown FIG. 8), comprising six blade centers with 14 blade servers in each. The rack-level data matrix based computation is most efficient while the CPU-level data matrix based computation is most accuracy. At step 910, the three-tier procedure starts with the rack-level data matrix. At step 920, the predictive fidelity is quantified by calculating the percentage error. If the percentage error is below certain pre-assigned threshold level, the computation is considered to be of high-fidelity. Otherwise in step 930, POD based predictions are computed for the blade center level data matrix. In step 940, the percentage error is computed and the fidelity assessment is made based on the percentage error. If fidelity criterion is not met, the computation goes to step 950 where predictions are made with CPU level data matrix. In step 960, the accuracy assessment is made and the quality of predicted data is specified.

The data matrix for the rack level, $T_{data}^{rack}$, for the entire rack can include all experimental samples. In an embodiment, $T_{data}^{rack}$ is a matrix of size n_time×N; where N=n_CPU×n_blade×n_BC×n_racks×n_sample. The row-wise mean of $T_{data}^{rack}$ to can be calculated to determine $T_0$. In some embodiments, a power iteration-based POD on $T_{data}^{rack}$ is used to compute POD modes, $\psi_{rack}$ and POD coefficient matrix, $B_{rack}$. A tolerance criteria may be selected to determine a principal component number and reduce the POD modes and POD coefficients. For example, using a 99% tolerance criteria, the principal component number is determined to be equal to 42 which corresponds to a 97.9% data compression. Based on the principal component number, the POD modes $\psi_{rack}$, and POD coefficient matrix, $B_{rack}$ are reduced or cut. In some embodiments, the POD coefficients $B_{rack}$ are segmented based on CPU locations and bilinear interpolation is applied on the segmented matrix to determine POD coefficient vector at the interrogation point, $b_{int}$.

In some embodiments, the prediction module, predicts temperatures for the CPU locations based on the at least one rack-level POD mode and the rack-level coefficients. The temperatures may be a temperature of a interrogation domain or location in the data center. The interrogation temperature can be predicted as: $T_{prediction}^{rack}=T_0+\psi_{rack} \otimes b_{int}$. After determining the interrogation temperature, a percentage error (e.g., predicted error) for the predicted temperature is calculated. In some embodiments, the percentage error is calculated as:

$$e = \frac{|T_{data}^{rack} - T_{prediction}^{rack}|}{T_{data}^{rack}} \times 100.$$

At step 920, the prediction module calculates a percentage error based on the temperature data for the CPU level. In some embodiments, the prediction module compares the temperatures for the CPU locations to a rack-level threshold value. The rack level threshold value may be a tolerance value to verify the accuracy of the predicted temperatures, such as 5%. In some embodiments, the percentage error is compared to the rack level threshold value. If the percentage error is less than or equal to the rack level threshold value, the predicted temperatures values predicted using the rack level data matrix are deemed to be acceptable and the method stops. If the percentage error is greater than the rack level threshold value (e.g., if e>tol), the method proceeds to step 930, to predict temperatures using the blade center level data matrix.

At step 930, using the blade center level data matrix, the decomposition module performs a POD of the blade center-level data matrix to determine at least one blade center-level POD mode and blade center-level coefficients for the blade center-level data matrix. The blade center level data matrix, $T_{data}^{BC}$, includes temperature data for the entire respective blade center level corresponding to the interrogation CPU across all experimental samples. The blade center level data matrix, $T_{data}^{BC}$ is a matrix of size n_time×N; where N=n_CPU×n_blade×n_sample. In some embodiments, the row-wise mean of $T_{data}^{BC}$ is calculated to determine $T_0$. A power iteration-based POD is applied to $T_{data}^{BC}$ to compute POD modes, $\psi_{BC}$, and POD coefficient matrix, $B_{BC}$. In some embodiments, a principal component number is determined based on a tolerance criteria, such as a 99% tolerance criteria. The POD modes, $\psi_{BC}$, and POD coefficient matrix, $B_{BC}$, can be modified (e.g., cut) based on the principal component number. In some embodiments, the POD coefficient matrix, $B_{BC}$, are further segmented based on CPU locations and a bilinear interpolation is applied on the segmented matrix to determine POD coefficient vector at the interrogation point, $b_{int}$.

In some embodiments, the prediction module predicts temperatures for the CPU locations based on the at least blade center-level POD mode and the blade center-level coefficients. The temperatures may be predicted for an interrogation domain or location of the blade center level. In some embodiments, the interrogation temperature is predicted as: $T_{prediction}^{BC}=T_0+\psi_{BC} \otimes b_{int}$. A percentage error for the interrogation temperature is determined, for example, $$e = \frac{|T_{data}^{BC} - T_{prediction}^{BC}|}{T_{data}^{BC}} \times 100.$$

At step 940, the prediction module calculates a percentage error based on the temperature data for the blade center level. In some embodiments, the prediction module compares the temperatures for the CPU locations to a blade center-level threshold value. The blade level threshold value may be tolerance value to verify the accuracy of the predicted temperatures, such as 5%. In some embodiments, the percentage error is compared to the blade center level threshold value. If the percentage error is less than or equal to the blade center level threshold value, the predicted temperatures values predicted using the blade center level data matrix are deemed to be acceptable and the method stops. If the percentage error is greater than the blade center level threshold value (e.g., if e>tol), the method proceeds to step 950, to predict temperatures using the CPU level data matrix.

At step 950, the decomposition module performs a POD of a CPU-level data matrix to determine at least one CPU-level POD mode and blade center-level coefficients for the CPU-level data matrix. In an embodiment, the CPU temperature data matrix, $T_{data}^{CPU}$ for the interrogation CPU across all experimental samples. $T_{data}^{CPU}$ is a matrix of size n_time×N; where N=n_sample. The row-wise mean of $T_{data}^{CPU}$ can be calculated to determine $T_0$. In some embodiments, a power iteration-based POD is applied on $T_{data}^{CPU}$ to compute POD modes, $\psi_{CPU}$, and POD coefficient matrix, $B_{CPU}$. A principal component number can be determined using a tolerance criteria, such as a 99% tolerance criteria. In some embodiments, POD modes, $\psi_{CPU}$, and POD coefficient matrix, $B_{CPU}$ can be modified based on the principal component number to reduce the size of each matrix. The POD coefficient matrix, $B_{CPU}$ can be segmented based on CPU locations and a bilinear interpolation can be applied on the segmented matrix to determine POD coefficient vector at the interrogation point, $b_{int}$.

In some embodiments, the prediction module can predict temperatures for the CPU locations based on the at least CPU-level POD mode and the CPU-level coefficients. The predicted temperatures may be for an interrogation domain or location at the CPU level. In some embodiments, the interrogation temperature is predicted as: $T_{prediction}^{CPU}=T_0+\psi_{CPU} \otimes b_{int}$. A percentage error can be calculated for the predicted temperatures, where the percentage error:

$$e = \frac{|T_{data}^{CPU} - T_{prediction}^{CPU}|}{T_{data}^{CPU}} \times 100.$$

In some embodiments, the prediction module compares the temperatures for the CPU locations to a CPU level threshold value. The CPU level threshold value may be tolerance value to verify the accuracy of the predicted temperatures. In some embodiments, the percentage error for the predicted temperatures at the CPU level is compared to the CPU level threshold value. If the percentage error is less than or equal to the CPU level threshold value, the predicted temperatures values predicted using the CPU level data matrix are deemed to be acceptable and the method stops. If the percentage error is greater than the CPU level threshold value (e.g., if e>tol), the method may return to step 910 and repeated the proceeds using a new data matrix for the rack level.

EXAMPLE

In an embodiment, an example data center is analyzed using the methods as described above in FIGS. 1-9. Referring, to FIG. 8, the details of a blade center rack "BC6" may be selected to be analyzed. Further, the circles on the blade center level 820 indicate the locations of the blades which are selected for the validation purpose. The selection is random: $2^{nd}$ $7^{th}$ and $14^{th}$ blades from the left. For $2^{nd}$ and $7^{th}$ blade, CPU-1 temperatures are analyzed; whereas, for $14^{th}$ blade CPU-2 blade temperature is analyzed. The methods discussed herein are applied to the CPU temperature data measured from an IBM blade center rack as shown in FIG. 8. The following symbols are extensively used in the following discussion pertaining to the functional method. Respective numerical values for an IBM blade center with dual core server are mentioned.

Number of racks (n_racks)=1; Number of Blade Centers (n_BC)=6; Number of Blades per BC (n_blade)=14; Number of CPUs per Blade (n_CPU)=2; Number of Temperature Levels (n_T)=4; Number of Pressure Levels (n_P)=3; Total number of experimental data samples (n_sample=n_T× n_P)= 12. Number of time samples (n_time)=44. The method as described above with respect to FIG. 9 for different length scales may have sequential steps, described as follows:

Rack-Level Method
1. Compile CPU temperature data matrix, $T_{data}^{rack}$ for the entire rack for all experimental samples. $T_{data}^{rack}$ is a matrix of size n_time×N; where N=n_CPU×n_blade× n_BC×n_racks×n_sample. For the present case study, N=2016.
2. Compute the row-wise mean of $T_{data}^{rack}$ to determine $T_0$
3. Apply Power iteration-based POD on $T_{data}^{rack}$ to compute POD modes, $\psi_{rack}$, POD coefficient matrix, $B_{rack}$.
4. Based on 99% tolerance criteria, the principal component number is determined to be equal to 42. It means 97.9% data compression.
5. Cut $\psi_{rack}$ and $B_{rack}$ based on principal component number.
6. Segment $B_{rack}$ based on CPU locations and apply bilinear interpolation on the segmented matrix to determine POD coefficient vector at the interrogation point, $b_{int}$.
7. The interrogation temperature is predicted as: $T_{prediction}^{rack} = T_0 + \psi_{rack} \otimes b_{int}$.
8. Determine percentage error:

$$e = \frac{|T_{data}^{rack} - T_{prediction}^{rack}|}{T_{data}^{rack}} \times 100.$$

9. If e>tol, then go to Blade Center-level method, where tol=5%.

Blade Center-Level Method
1. Compile CPU temperature data matrix, $T_{data}^{rack}$ for the entire Blade Center corresponding to the interrogation CPU across all experimental samples. $T_{data}^{BC}$ is a matrix of size n_time×N; where N=n_CPU×n_blade× n_sample. For the present case study, N=336.
2. Compute the row-wise mean of $T_{data}^{BC}$ to determine $T_0$
3. Apply Power iteration-based POD on $T_{data}^{BC}$ to compute POD modes, $\psi_{BC}$, POD coefficient matrix, $B_{BC}$.
4. Based on 99% tolerance criteria, the principal component number is determined to be equal to 42. It means 87.5% data compression.
5. Cut $\psi_{BC}$ and $B_{BC}$ based on principal component number.
6. Segment $B_{BC}$ based on CPU locations and apply bilinear interpolation on the segmented matrix to determine POD coefficient vector at the interrogation point, $b_{int}$.
7. The interrogation temperature is predicted as: $T_{prediction}^{BC} = T_0 + \psi_{BC} \otimes b_{int}$.
8. Determine percentage error:

$$e = \frac{|T_{data}^{BC} - T_{prediction}^{BC}|}{T_{data}^{BC}} \times 100.$$

9. If e>tol, then go to CPU-level method, where tol=5%.

CPU-Level Method
1. Compile CPU temperature data matrix, $T_{data}^{CPU}$ for the interrogation CPU across all experimental samples. $T_{data}^{CPU}$ is a matrix of size n_time×N; where N=n_sample. For the present case study, N=12.
2. Compute the row-wise mean of $T_{data}^{CPU}$ to determine $T_0$.
3. Apply Power iteration-based POD on $T_{data}^{CPU}$ to compute POD modes, $\psi_{CPU}$, POD coefficient matrix, $B_{CPU}$.
4. Based on 99% tolerance criteria, the principal component number is determined to be equal to 11. It means 8.3% data compression.
5. Cut $\psi_{CPU}$ and $B_{CPU}$ based on principal component number.
6. Segment $B_{CPU}$ based on CPU locations and apply bilinear interpolation on the segmented matrix to determine POD coefficient vector at the interrogation point, $b_{int}$.
7. The interrogation temperature is predicted as: $T_{prediction}^{CPU} = T_0 + \psi_{CPU} \otimes b_{int}$.
8. Determine percentage error:

$$e = \frac{|T_{data}^{CPU} - T_{prediction}^{CPU}|}{T_{data}^{CPU}} \times 100.$$

The capability of high-fidelity temperature generation can be leveraged to determine the optimal cooling environment for a time-varying workload profile. The mathematical optimization problem of the optimal cooling design can be formulated as:

$$\left\{\begin{array}{l}\text{Maximize } T_{Sup}\\ \text{Minimize } \Delta P_{RDHx}\end{array}\right\}$$

Constraint: $\max(T_{CPU}) < 65°$ C.

The optimal cooling design offers most cost-efficient DC operation because the maximization of CRAC supply temperature under the given constraint amounts to the minimum chiller work. It can impact 64% of data center cooling cost. On the other hand, the minimization of rear door heat exchanger driving pressure under the given constraint optimizes building chilled water pump work, which typically amounts to 9% of data center cooling cost. The constraint in the optimization problem specifies the reliability limit of most modern processors.

Figure 10:
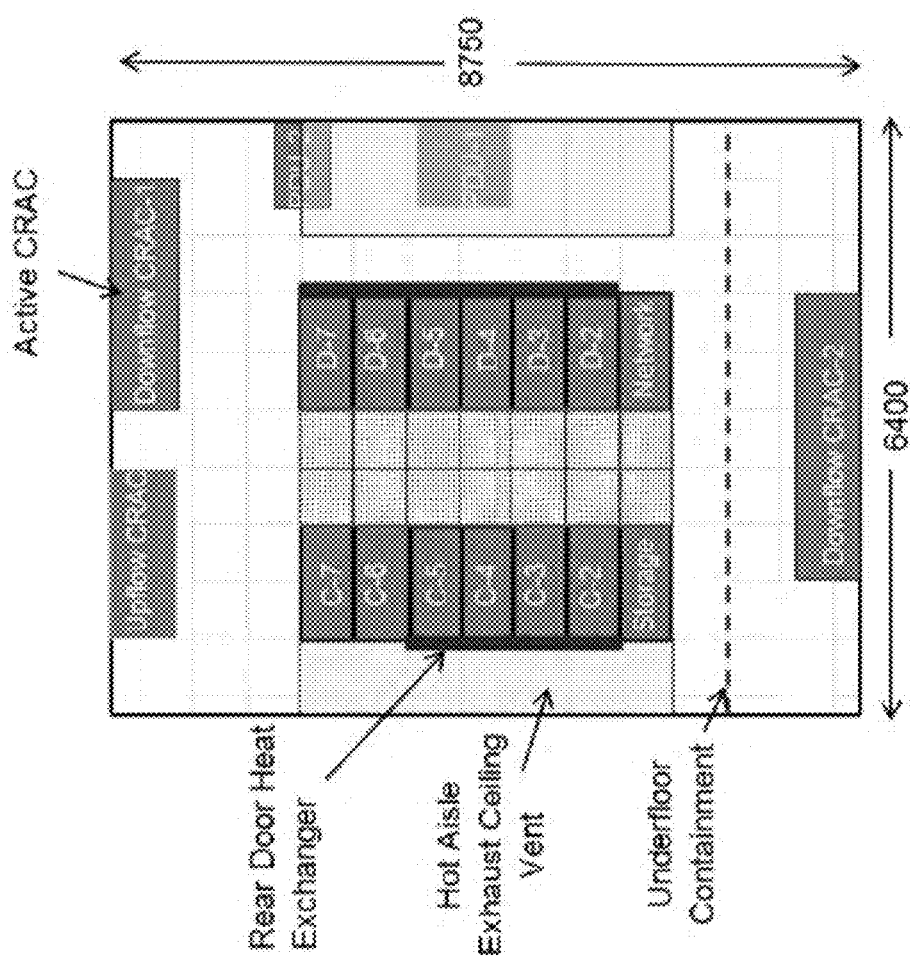
FIG. 10 depicts an embodiment of an experimental raised-floor data center facility.

FIG. 10 shows the experimental raised-floor data center (DC) facility (located at Atlanta, Ga. at elevation ~1,027' (313 m)) with three computer room air conditioning (CRAC) units. For this experimental study, rack D-5 is used as the test rack. Installed with an underfloor plenum of depth 912 mm (3') and drop ceiling height 1727 mm (5'8"), the facility height is 3048 mm (10'). For this case study, only CRAC-1 which is an APC 5 kW down flow unit (CW-140-C-KA-D) is operational. The rated cooling capacity of this CRAC unit is 140 kW (40 ton). This unit is installed with a belt-driven centrifugal fan which is rated to supply 12,200 CFM (5.76 m³/s) cooling air. The cooling hardware (cooling coil and electric heater) inside CRAC unit is controlled by micro-processor-based PID controller with supply air temperature as the set point. The relative humidity of the supply air is maintained at 40%. 10 of 14 racks in the test facility are installed with RDHx-s (Vatte Liquid Cooling) of nominal cooling capacity 18 kW and maximum cooling capacity 24 kW. The overall cooling capacity of these RDHx-s is controlled by centralized pressure differential set point. Table 1 specifies the experimental condition. The heat load column shows average rack heat load, measured by Rack Load Tester. The tile flow column shows cooling air coming out through the perforated tile, measured by Balometer (Shortbridge ADM-860C). The rack flow column shows air drawn by rack fans, measured by Rack Load Tester.

The Rack Load Tester consists of an array of 15×3 sensors (45 sensors). It is placed at the outlet of the rack attached to an aluminum frame structure covered by a cloth skirt to prevent air from bypassing the sensors. Each sensor consists of a thermistor to measure temperature, and a constant temperature hot wire anemometer to measure air velocity. The sensors used were standard Accusense F900. These specification measurements are done when CRAC supply temperature is kept at 15.5° C. (60 F) and RDHx differential pressure is kept at 8 psi.

It can be observed that Tile Flow is 6238 CFM and Rack Flow 20278 CFM. Since Tile Flow or cooling air supply is 69.2% lower compared to Rack Flow or rack demand, the facility is severely under-provisioned.

TABLE 1

Specification of the Experimental Setup

| Rack | Description | RDHx | Heat Load kW (+/−) 5% | Tile Flow CFM (+/−) 5% | Rack Flow CFM (+/−) 5% |
|---|---|---|---|---|---|
| C-1 | Storage | No | 5.2 | 397 | 1015 |
| C-2 | IBM Blade | Yes | 11.4 | 490 | 1579 |
| C-3 | IBM Blade Center Rack | Yes | 11.7 | 533 | 1651 |
| C-4 | IBM Blade Center Rack | Yes | 11.9 | 390 | 1617 |
| C-5 | IBM Blade Center Rack | Yes | 11.8 | 470 | 1447 |
| C-6 | 1-U Server Rack | No | 0.0 | 488 | 1200 |
| C-7 | Empty | No | 7.8 | 439 | 267 |
| D-1 | Network | No | 4.5 | 371 | 1061 |
| D-2 | IBM Blade Center Rack | Yes | 11.8 | 434 | 1603 |
| D-3 | IBM Blade Center Rack | Yes | 11.7 | 377 | 1658 |
| D-4 | IBM Blade Center Rack | Yes | 11.3 | 415 | 1724 |
| D-5 | IBM Blade Center Rack (Test Rack) | Yes | 11.9 | 484 | 1716 |
| D-6 | IBM Blade Center Rack | Yes | 11.9 | 483 | 1858 |
| D-7 | IBM Blade Center Rack | Yes | 12.0 | 467 | 1882 |

In this example, rack D-5 is used as the test rack. It consists of 6 IBM blade centers. Each blade center contains 14 blade servers. Each blade has two dual-core AMD Opteron 270 processors, 4 GB of memory, and is installed with the VMware vSphere Hypervisor (ESXi) v4.1. The blades are interconnected via a Force 10 E1200 switch over a flat IP space. Each blade hosts one virtual machine installed with 64-bit Ubuntu 11.10. Since these blades are CPU-dominant in terms of power consumption, we configure those virtual machines with 4 virtual CPUs to exploit the maximum power usage. The VMware vSphere server and client software are used to manage the cloud. For the purpose of profiling, the workload in a given VM needs to be precisely controlled, which is performed by wileE benchmark. It enables generation of user-defined transient CPU and memory utilization profiles for an arbitrary period of time. To emulate the real-world workload, the workload is discretized into instances of different wileE workload. The wileE benchmark can automatically perform those instances in time sequence via the use of multicast. The test rack is equipped with a PI system developed by OSIsoft. Via this PI system, the data streams generated from various sensors are transmitted to SQL database in real time. The measurement data are retrieved from this database, and subsequent analyses are performed using the framework described in the previous section. The CPU temperature data for this experiment.

Figure 11:
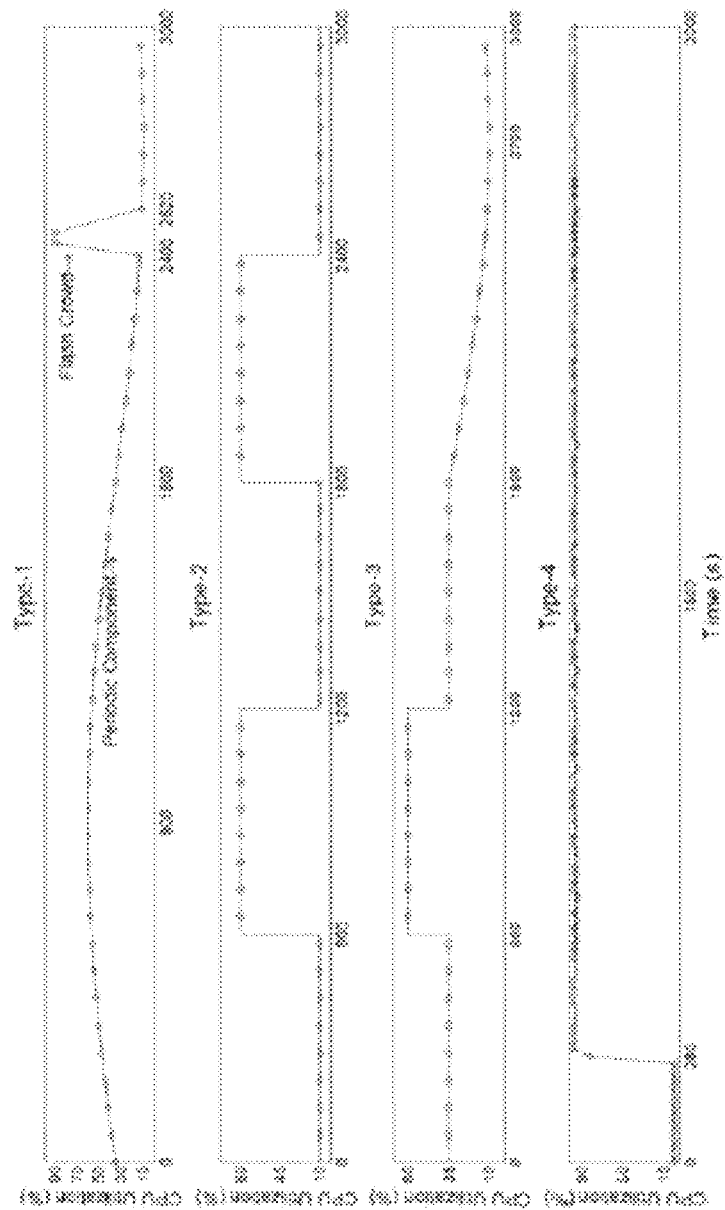
FIG. 11 depicts an embodiment of a graph of CPU/memory usage profiles.

FIG. 11 shows CPU utilization profiles used in this case study. The duration of each profile is 3000 s. There are four types of workloads: Type 1, Type 2, Type 3, and Type 4. The Type 1 (typical of an internet data center (IDC)) has two fundamental components: the first one is a regular periodic component, and the other one is a discontinuous component. The latter represents a flash crowd in a data center. These flash crowd events are characterized by very high IT demand for a short duration of time. At t=0, the profile starts at 35% utilization. Then, it varies in a sinusoidal manner with 25% amplitude and 3600 s time period. The flash crowd occurs at 2400 s when the utilization profile suddenly shoots up.

Within 30 s, it increases to 90% utilization. The resource utilization remains constant for 30 s between 2430-2460 s. Then, it plummets to the original periodic profile within next 60 s. From 2520 s, it continues the regular periodic profile.

For Type 2 (typical of financial data centers), this profile simulates a square waveform with 70% amplitude and a half time period of 600 s. This particular waveform has two peaks: the first one starts at 600 s and continues till 1200 s, while second one starts at 1200 s and continues till 2400 s. The lower IT utilization point in this profile is 10%; on the other hand, the higher IT utilization point is 80%.

For Type 3 (typical of enterprise data centers), this profile combines a square waveform with a sine waveform. The square waveform lasts from 0-1800 s. It has one peak between 600-1200 s with 25% amplitude. It has a lower IT utilization point of 35% and higher IT utilization point of 60%. The subsequent part of this combined waveform is a sine wave with 25% amplitude with 3600 s time period. It starts at 1800 s with 35% utilization. It subsequently reaches 10% utilization at 2700 s.

For Type 4 (typical of high performance computing data centers), this profile is related to high performance computing services. This profile is characterized by a sudden jump at 280 s. While this profile has (0.24±0.0126)% CPU utilization before 280 s, it shoots up to (98.38±1.14)% CPU utilization after 280 s.

Figure 12:
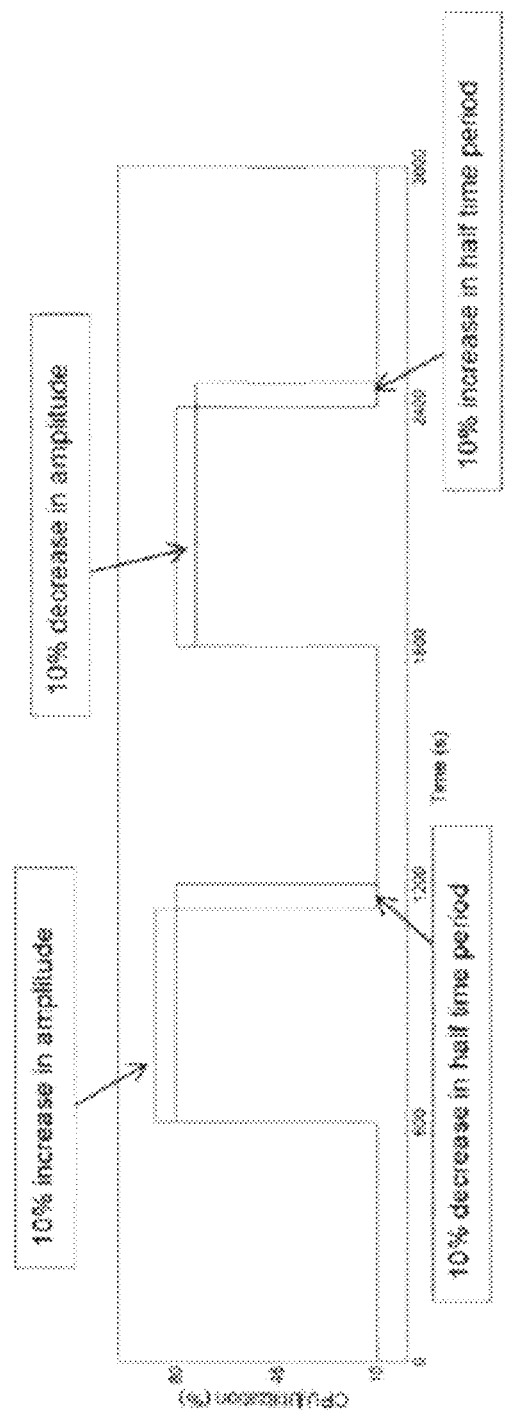
FIG. 12 depicts an embodiment of a graph of a Type-2 profile along with a distorted Type-2 profile.

For studying the sensitivity of the predictive framework with respect to the uncertainty in the workload pattern, a distorted profile of Type-2 waveform is developed. FIG. 12 shows a Type-2 profile along with a distorted Type-2 profile. While the first line is the original Type-2 profile, the second line is the distorted Type-2 profile. The original Type-2 profile has been changed in four places to obtain the distorted profile. First, the amplitude of the first peak is increased by 10% to 73.5%. Second, the half time period of the first square pulse is decreased by 10% to 540 s. Therefore, the first peak finishes at 1140 s instead of 1200 s. Third, the amplitude of the second peak is decreased by 10% to 66.5%. Finally, the half time period of the second square pulse is increased by 10% to 660 s. Therefore, the second peak finishes at 2460 s instead of 2400 s.

Figure 13:
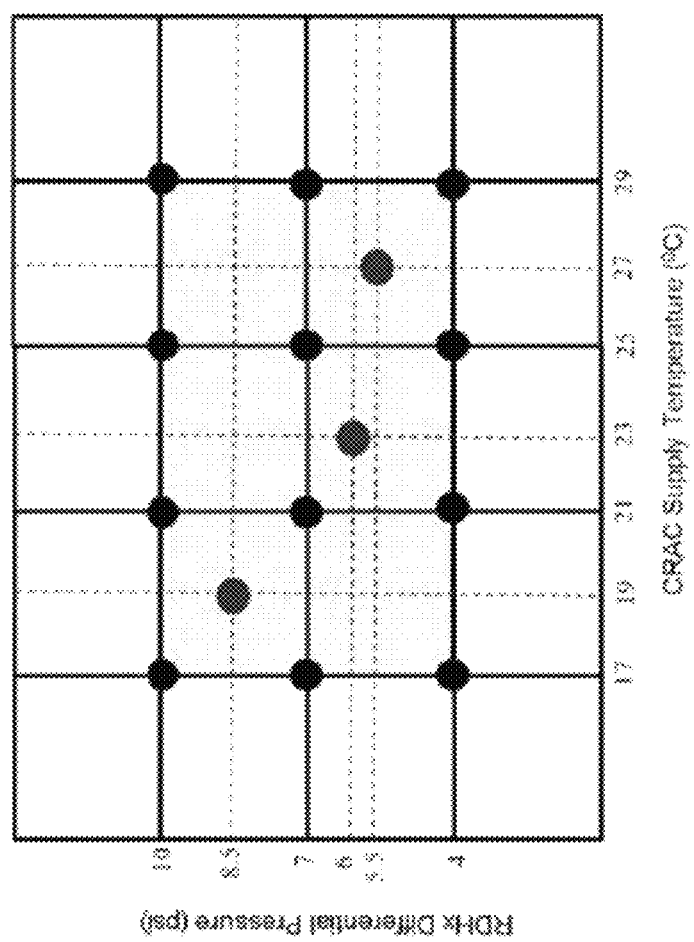
FIG. 13 depicts an embodiment of parametric input space.

In FIG. 13, the interrogation space is comprised different possible combinations of CRAC supply temperature ($T_{sup}$) and RDHx differential pressure ($\Delta P_{RDHx}$). Black circles indicate the parametric locations of the input ensemble. The lighter circles indicate the parametric locations of the prediction points.

Figure 14:
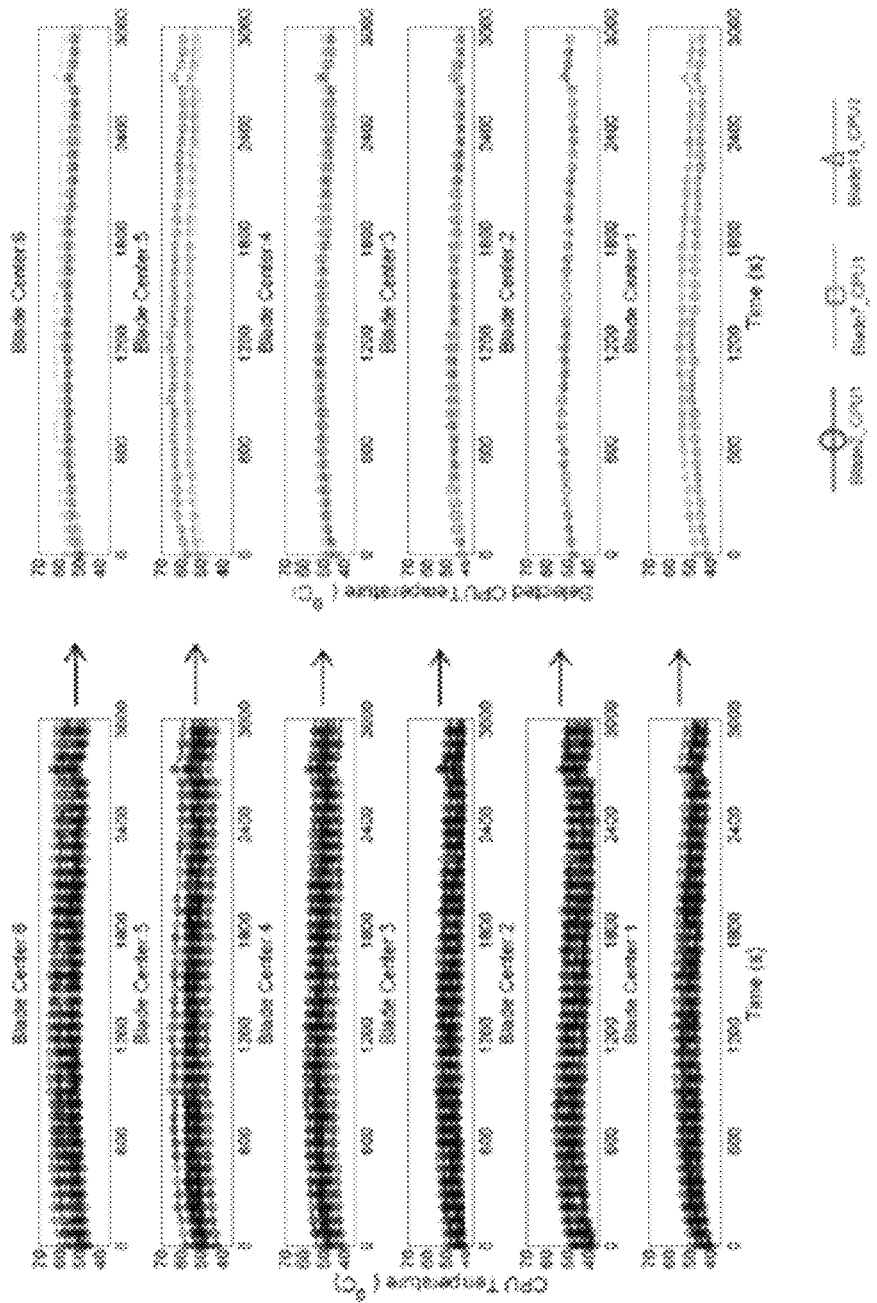
FIG. 14 depicts an embodiment of graphs of different transient CPU temperatures for six different blade centers.

FIG. 14 shows transient CPU temperatures for six different blade centers for Type-1 workload operating at (17° C., 4 psi). There are 28 CPUs in a blade center with dual-core blade servers. Therefore, CPU temperature data are densely packed. For visualization purpose, three CPUs are picked. They are CPU1 at Blade2; CPU1 at Blade7, and CPU2 at Blade14. In FIG. 14, CPU temperature data at (17° C., 4 psi) operating condition for Type-1 load profile. Three visualization CPUs are chosen: CPU1 at Blade2; CPU 1 at Blade7, and CPU2 at Blade14.

Figure 15:
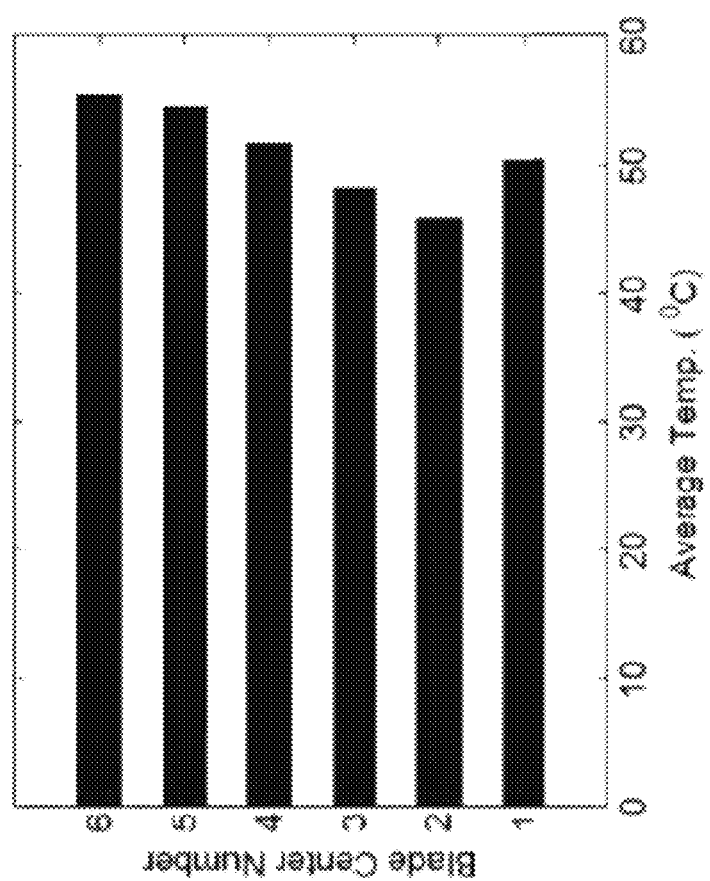
FIG. 15 depicts an embodiment of average temperature for different blade centers for Type-1 workload at (17° C., 4 psi).

It can be readily observed from FIG. 14, which depicts average temperature for different blade centers for Type-1 workload at (17° C., 4 psi), that the average CPU temperature is highest near the top of the rack. FIG. 15 shows average CPU temperature for each blade center. While average CPU temperature is equal to 50.4° C. in blade center 1, that is 55.4° C. in blade center 6. Higher CPU temperature near the top of the rack is caused by the warmer rack inlet temperature near the top of the rack due to hot air recirculation near the top of the rack. The effect of hot air recirculation is pronounced in this case-study because the cooling air supply in this experimental facility is severely under-provisioned. Moving down the rack, average CPU temperature decreases as the effect of hot air recirculation gradually diminishes. Nevertheless, average CPU temperature increases unexpectedly for blade center 1. This is because of the Venturi effect at the foot of the rack. Although there is a distinct trend in the vertical direction, there is no such trend in the horizontal direction. The CPU temperatures seem to undergo a random spatial variation within a particular blade center.

Figure 16:
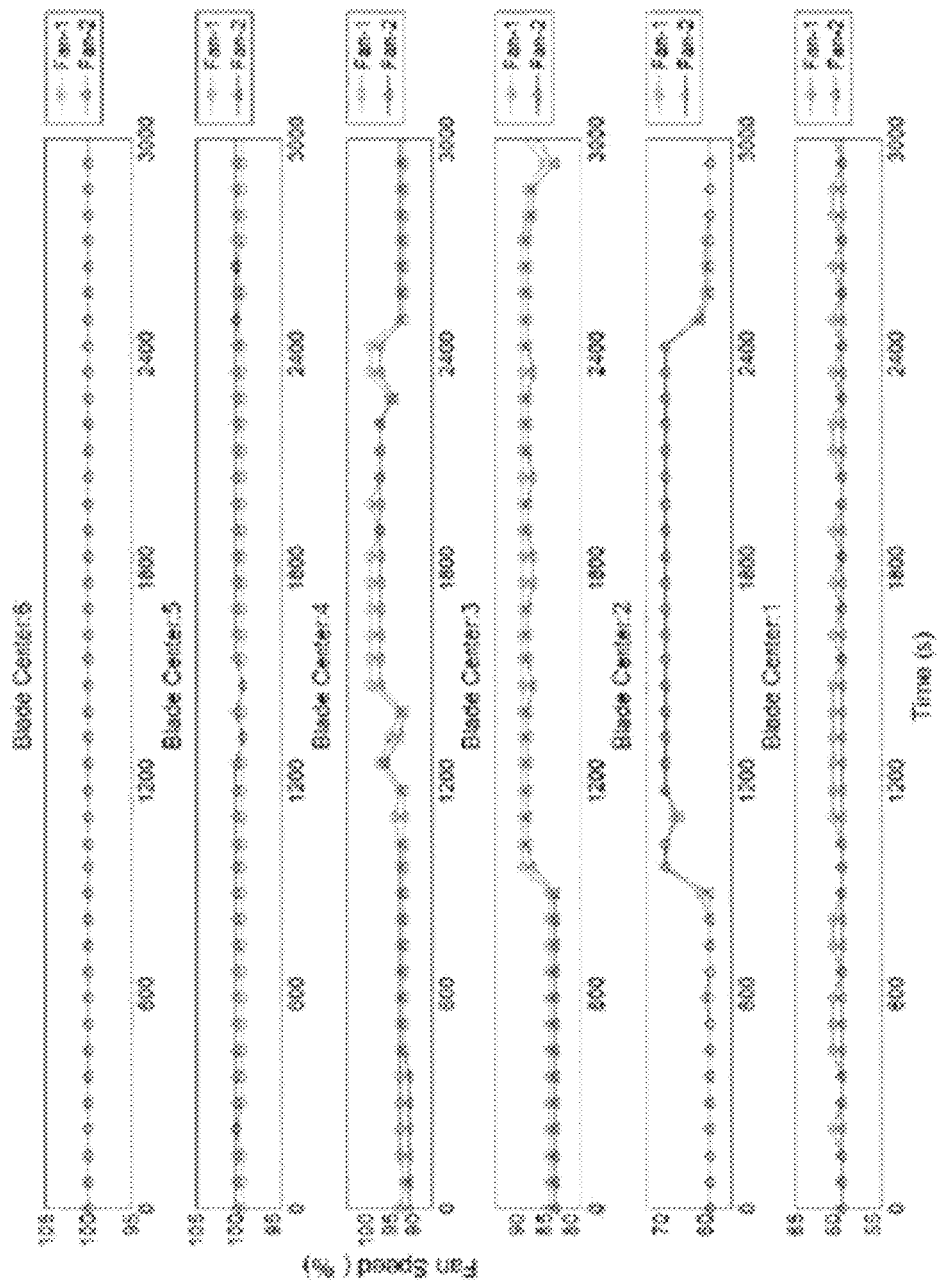
FIG. 16 depicts an embodiment of transient evolution of server fan speeds.

Each IBM blade center has two mutually-facing centrifugal fans. FIG. 16 depicts transient evolution of server fan speeds, for example, fan speed variation with Type-1 workload at (17° C., 4 psi) cooling set-points. The speeds of these fans are controlled by rack inlet temperatures. Therefore, it is expected that fan speeds near the top of the rack would be higher than near the bottom. Indeed, it is observed that Blade Center (BC) 6 and BC 5 fans are operating at 100% capacity which can be explained by their larger inlet temperatures. Fans in BC4, BC3, and BC2 show a transient pattern. Fans start to operate from [95%, 85%, 60%] respectively; then, fan speed increases at around 900 s. Fan speeds fall at around 2500 s. This is somewhat consistent with Type-1 load profile. Fan speed increases during peak power and flash crowd events. It falls as the amplitude of the workload decreases. Surprisingly, the BC-1 fan speed remains flat which can be explained from local cooling dominated by the Venturi effect.

The CPU temperatures and server fan speed show the expected behavior. A similar pattern is expected to continue for other cooling environments. The data matrix is compiled based on experimentally-measured CPU temperature data. The proposed method is applied on the data matrix and the CPU temperature signals are computed. For a fidelity check, the percentage error between CPU temperature data and predictions are computed. Table 2 shows the root mean square (RMS) value of time-averaged (0-3000 s with 44 time samples) error across 168 CPUs in the test rack.

TABLE 2

Percentage error for different workload types at different operating points

| Training Workload | Cooling Set-point | RMS of Time-averaged Error | 99.7% Confidence Interval |
|---|---|---|---|
| Type-1 | (19° C., 8.5 psi) | 2.39% | 3.28% |
| Type-1 | (23° C., 6.0 psi) | 1.75% | 2.41% |
| Type-1 | (27° C., 5.5 psi) | 2.44% | 3.39% |
| Type-2 | (19° C., 8.5 psi) | 3.38% | 5.34% |
| Type-2 | (23° C., 6.0 psi) | 2.57% | 3.1% |
| Type-2 | (27° C., 5.5 psi) | 2.60% | 4.49% |
| Type-3 | (19° C., 8.5 psi) | 3.30% | 4.01°% |
| Type-3 | (23° C., 6.0 psi) | 2.78% | 3.33% |
| Type-3 | (27° C., 5.5 psi) | 2.16% | 2.42% |
| Type-4 | (19° C., 8.5 psi) | 2.23% | 2.46% |
| Type-4 | (23° C., 6.0 psi) | 2.56% | 2.8% |
| Type-4 | (27° C., 5.5 psi) | 2.35% | 2.81% |

Table 2 shows that the maximum value of the RMS of time-averaged error for Type-1 workload is equal to 2.56%, that for Type-2 workload is equal to 3.38%, that for Type-3 workload is equal to 3.3%, and that for Type-4 workload is equal to 2.56%. On the other hand, the maximum error bound for the numerical procedure is 10%. Hence, the developed framework is accurate within a +/−10% uncertainty interval. However, as suggested by the RMS values, the framework is predicting much better than the 10% upper bound. Hence, it can be claimed that the proposed POD-based framework is capable of generating high-fidelity temperature predictions for any cooling operating points ($T_{int}$, $P_{int}$) such that $T_{int} \in [17°$ C., $29°$ C.$] \cup P_{int} \in [4$ psi, $10$ psi$]$.

Figure 17A:
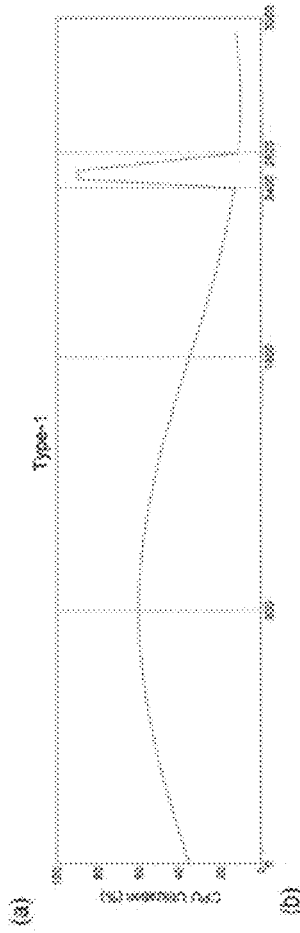
FIGS. 17a-d depict embodiments of optimal cooling resource allocation for Type-1 workload.
Figure 17B:
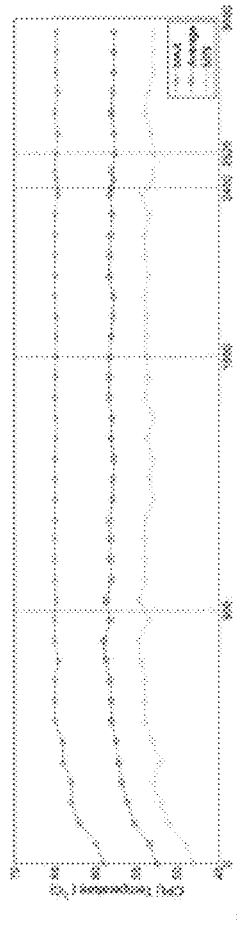

Given that the fidelity of the prediction framework is established, the optimal controller for different workload profiles can be designed. The initial starting point is (29° C., 4 psi), which is the most cost-efficient point. Then, if the maximum CPU temperature is identified to be more than the critical reliability limit, such as 65° C., the cooling set-points are adjusted by 0.5° C. increments in CRAC supply air temperature and 0.5 psi decrements in RDHx. Lower supply temperature set points for CRAC means higher CRAC operating cost and vice ersa. On the other hand, higher RDHx operating pressure means higher RDHx cost and vice versa. FIGS. 54a-d show optimal cooling resource allocation for Type-1 workload. FIG. 17(a) shows the load profile for Type-1 workload, which is a sine waveform with amplitude 25% and period 3600 s. The first peak is reached at 900 s. At 1800 s, the waveform reaches its half-time period. These time instants are marked by dotted lines. Additionally, the beginning (2400 s) and the end (2520 s) of the flash crowd profile are also marked with dotted lines. FIG. 17(b) shows the maximum, average, and minimum CPU temperature profiles for the optimal cooling set-point envelope. The optimization procedure determines the most cost-effective cooling set-points under the given constraint of maintaining CPU junction temperature below 65° C.

Figure 17C:
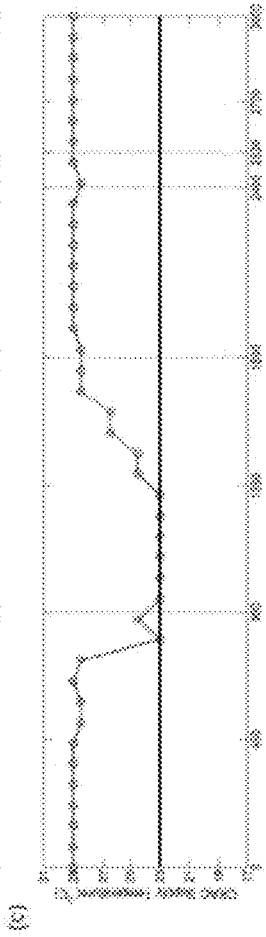
Figure 17D:
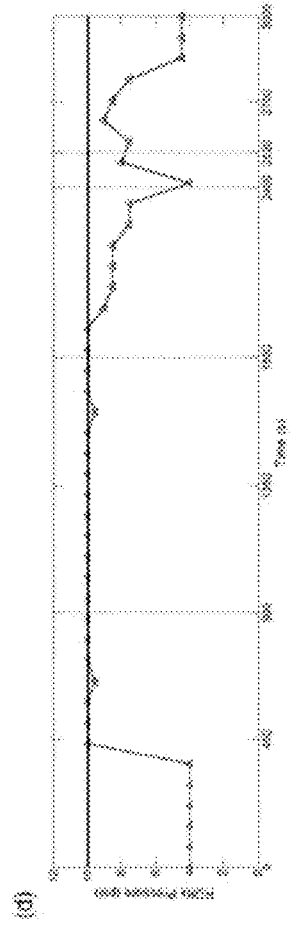

FIG. 17(c) and FIG. 17(d) show optimal CRAC supply temperature and RDHx pressure set points, respectively. Initially, CRAC supply temperature and RDHx pressure could satisfy the temperature constraint by operating at the most cost-effective set point of (29° C., 4 psi). With increase in CPU utilization and associated CPU power dissipation, cooling set-points need to deviate from the cost-efficient operational mode. In fact, the RDHx pressure set-point jumps rapidly from 4 psi to 10 psi between [363 s-436 s]. At 436 s, the CRAC supply temperature responds by dipping down by 0.5° C. to 28.5° C. and remains there till 581 s. Between 581 s-654 s, it increases to move back to the 29° C. set-point. Between 654 s-732 s, it decreases to 28.5° C. Between 720 s-792 s, it plummets to 23° C. RDHx pressure set-point, on the other hand, remains somewhat flat after 436 s except for experiencing a minor dip by 0.5 psi between 581 s-732 s. Similar dynamic adjustments of cooling set-points continue in the entire time domain based on the proposed mathematical optimization procedure. The cooling hardware response during the flash crowd between 2400 s-2520 s is particularly interesting. Between 2415 s-2488 s, there is a steep jump in RDHx pressure set-point from 4 psi to 8 psi. On the other hand, the CRAC supply air temperature surprisingly increases from 28.5° C. to 29° C. during that time window. During the next part of the flash crowd between 2488 s-2560 s, the RDHx pressure decreases by 0.5 psi and the CRAC supply temperature remains flat. Between RDHx and CRAC, RDHx is more responsive to rack CPU utilization or power variation. It can be explained by the fact that RDHx is more tightly-coupled to a given rack. While CRAC is responsible for cooling of several racks inside the facility, RDHx is responsible for a given rack.

Figures 18A, 18B:
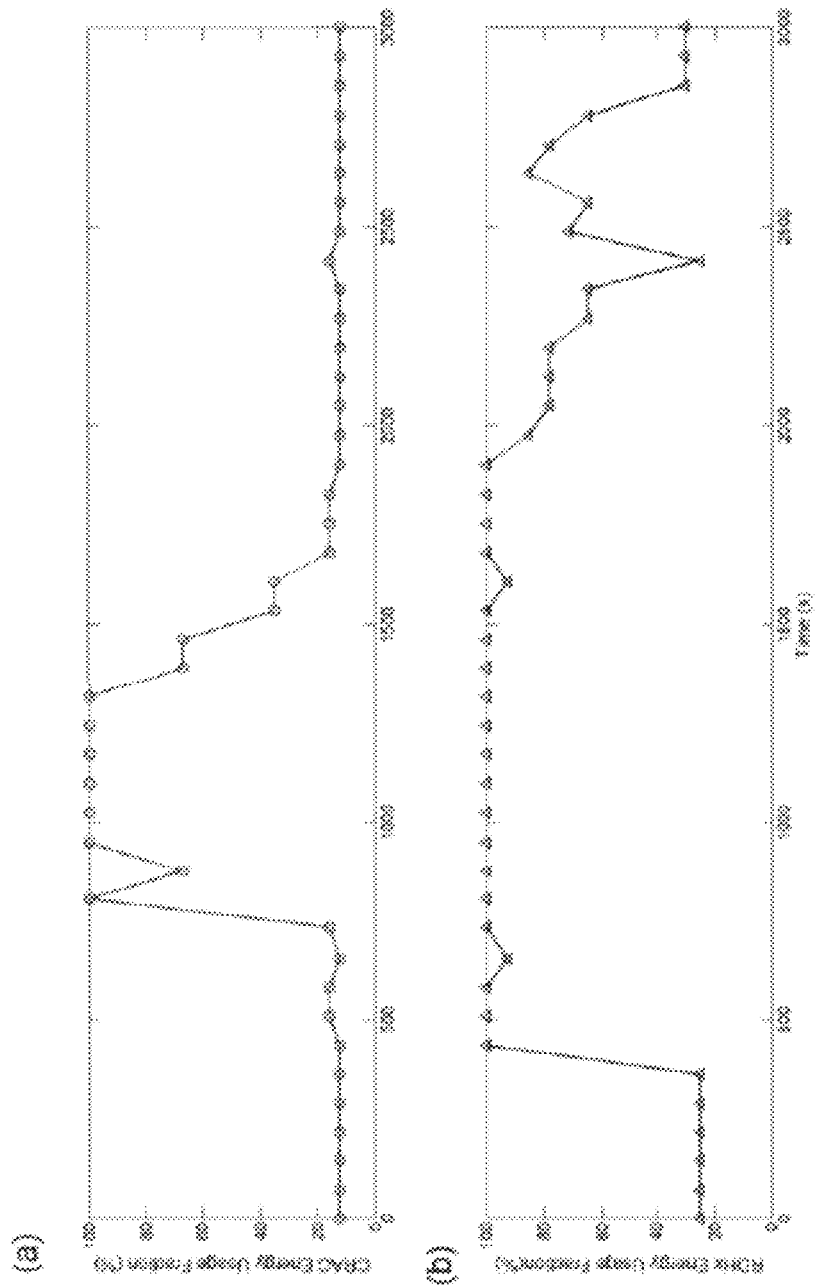
FIGS. 18a-b depict embodiments of cooling energy savings for Type-1 workload.

The lines in FIG. 17(c) and FIG. 17(d) show the most conservative set-points for CRAC (23° C.) and RDHx (10 psi), respectively. If there is no optimal control procedure, a conservative DC facility manager would operate his/her data center cooling at these points. Therefore, the developed approach has the potential to save cooling energy. FIGS. 18a-b show cooling energy savings for Type-1 workload, for example, the cooling energy saving potential of the developed optimization framework. FIG. 18(a) shows the fraction of energy usage by the CRAC unit operating in the optimal mode to that by a similar CRAC unit operating in the conservative mode. On the other hand, FIG. 18(b) shows the fraction of energy usage by the RDHx unit operating in the optimal mode to that by a similar RDHx unit operating in the conservative mode. The root mean square value of the fraction of energy saving in CRAC is equal to 51.4%. On the other hand, that value in RDHx is equal to 18.5%.

Figures 19A, 19B, 19C, 19D:
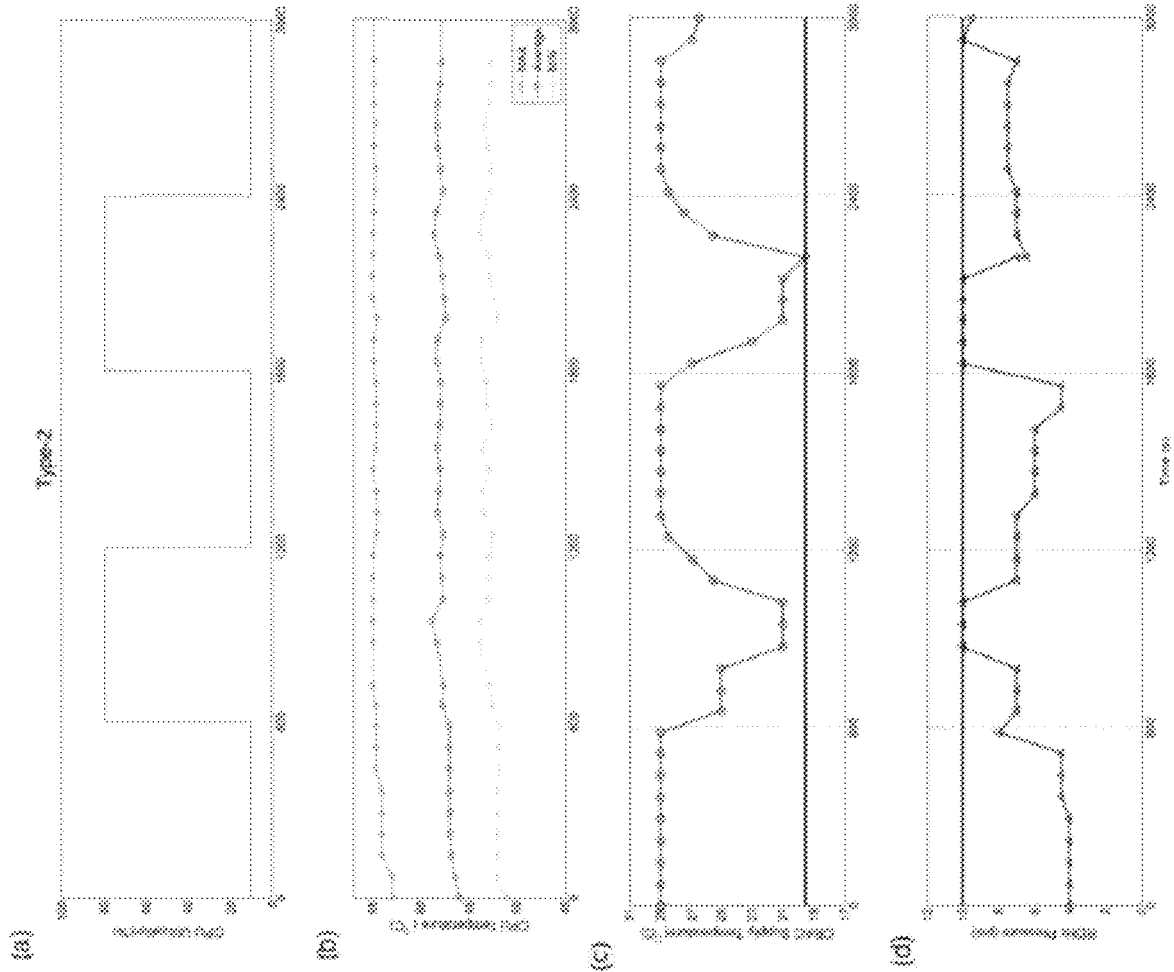
FIGS. 19a-d depict embodiments of optimal cooling resource allocation for Type-2 workloads.

FIGS. 19a-d depict optimal cooling resource allocation for Type-2 workloads. FIG. 19(a) shows the load profile for Type-2 workload, which is a square waveform with amplitude 70% and half-time period 600 s. FIG. 19(b) shows the maximum, average, and minimum CPU temperature profiles for the optimal cooling set-point envelope. The optimization procedure determines the most cost-effective cooling set-points under the given constraint. FIG. 19(c) and FIG. 19(d) show optimal CRAC supply temperature and RDHx pressure set points, respectively. Initially, CRAC supply temperature and RDHx pressure could satisfy the temperature constraint by operating at the most cost-effective set point of (29° C., 4 psi). With increase in CPU utilization and associated CPU power dissipation, cooling set-points need to deviate from the cost-efficient operational mode. As expected, there are major changes in cooling set-points around the discontinuities of the step profile at 600 s, 1,200 s, 1,800 s, and 2,400 s. In fact, the RDHx pressure set-point jumps rapidly from 4.5 psi to 8 psi between [512 s-584 s]. On the other hand, the CRAC supply temperature falls from 29° C. to 25° C. between [584 s-658 s]. Similar dynamic variations of cooling set-points are observed across the entire time window. There are some counter-intuitive variations in CRAC supply temperature and RDHx pressure, especially in the later parts of the two square peaks: CRAC supply temperature increases between [1026 s-1171 s] and between [2194 s-2342 s]; RDHx pressure decreases between [1026 s-1099 s] and between [2121 s-2194 s]. These changes are surprising because one would expect cooling set-points to remain flat without any change in the CPU utilization. However, these anomalous behaviors can be explained by the coordinated nature of the dynamic cooling condition with IT load: The cooling points determined in the previous time samples to these anomalous time ranges must have over-provisioned the cooling requirements and created some local cooling sources such as over-cooled server chassis body. These local cooling sources act as a thermal capacitance for CPU heat loads and modify cooling load for the dedicated hardware such as CRAC or HDHx. Due to its rapid fluctuations, Type-2 load profile is more sensitive to this thermal capacitance effect than its Type-1 counterpart.

Figures 20A, 20B:
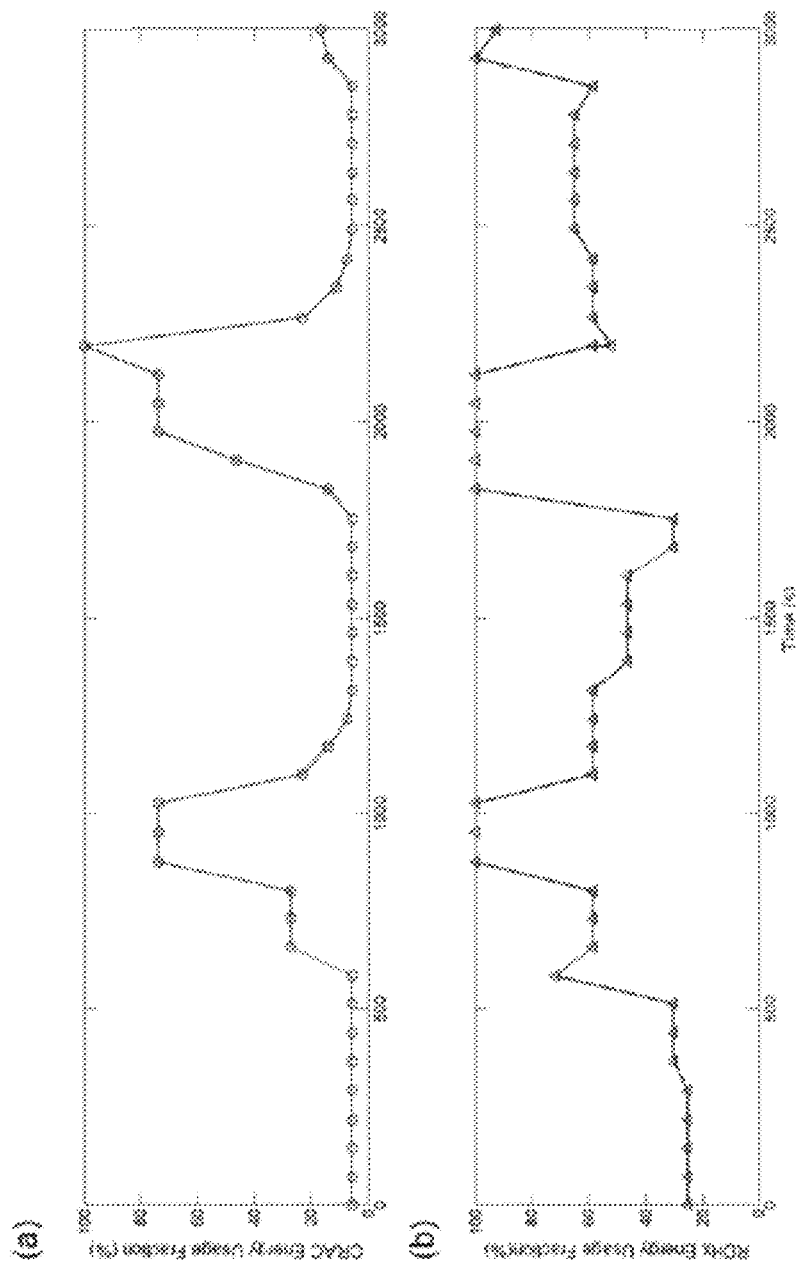
FIGS. 20a-b depict embodiments of cooling energy savings for Type-2 workload.

The lines in FIG. 19(c) and FIG. 19(d) show the most conservative set-points for CRAC (19.5° C.) and RDHx (10 psi), respectively. If there is no optimal control procedure, a risk-averse DC facility manager would operate his/her data center cooling at these conservative points. Therefore, the developed approach has the potential to save cooling energy. FIG. 18 shows the cooling energy saving potential of the developed optimization framework. FIGS. 20a-b depict the cooling energy savings for Type-2 workload. FIG. 20(a) shows the fraction of energy usage by the CRAC unit operating in the optimal mode to that by a similar CRAC unit operating in the conservative mode. On the other hand, FIG. 20(b) shows the fraction of energy usage by the RDHx unit operating in the optimal mode to that by a similar RDHx unit operating in the conservative mode. The root mean square value of the fraction of energy saving in CRAC is equal to 62.7%. On the other hand, that value in RDHx is equal to 34.4%.

Figure 21A:
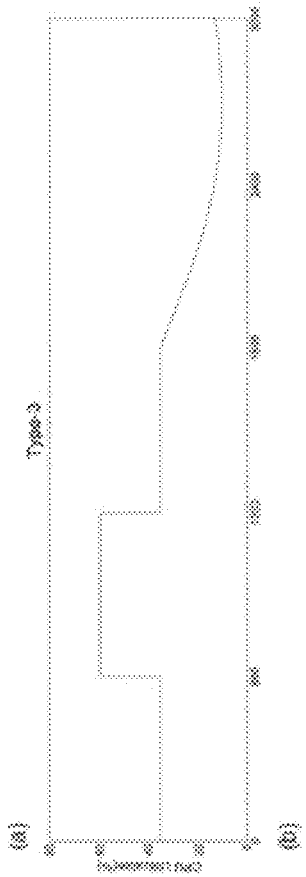
FIGS. 21a-d depict embodiments of optimal cooling resource allocation for Type-3 workload profiles.

FIGS. 21a-d depict optimal cooling resource allocation for Type-3 workload profiles. FIG. 21(a) shows the load profile for Type-3 workload which is a combination of square waveform and sinusoidal waveform. The square waveform has amplitude of 25% and half-time period 600 s. In Type-3 workload profile, the square waveform lasts during [0-1800 s] with one square peak. The sine waveform lasts during [1800 s-3000 s]. It has amplitude of 25% with 3600 time period.

Figure 21B:
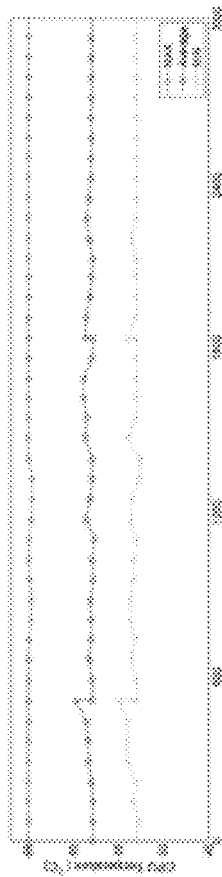
Figure 21C:
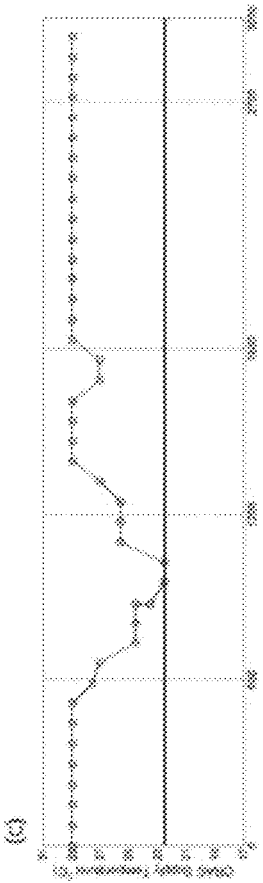
Figure 21D:
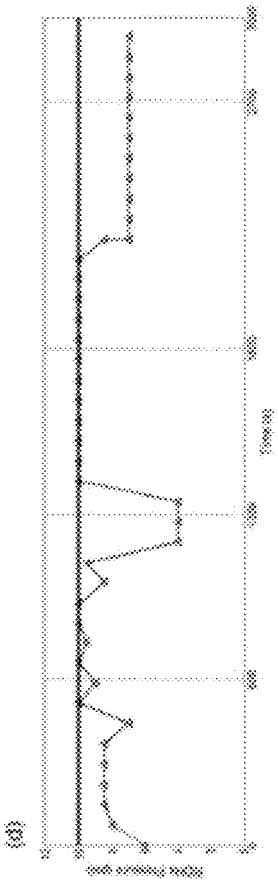

FIG. 21(b) shows the maximum, average, and minimum CPU temperature profiles for the optimal cooling set-point envelope. The optimization procedure determines the most cost-effective cooling set-points under the given constraint. FIG. 21(c) and FIG. 21(d) show optimal CRAC supply temperature and RDHx pressure set points, respectively. Initially, the CRAC supply temperature and RDHx pressure could satisfy the temperature constraint by operating at the most cost-effective set point of (29° C., 4 psi). With increase in CPU utilization and associated CPU power dissipation, cooling set-points need to deviate from the cost-efficient operational mode. As expected, there are major changes in cooling set-points around the discontinuities of the step profile at 600 s, 1,200 s, and 1,800 s. In fact, the pattern of cooling set-point changes between [0-1800 s] remains similar to that of the Type-2. In this profile, however, the degree of changes is moderate because the amplitude of the square waveform is equal to 25% which is 64.3% lower than Type-2 profile. On the other hand, it is expected that the changes in cooling set-points will be moderate during the sine waveform in the [1800 s-3000 s] time domain. Indeed, that is reflected in the CRAC supply temperature set point, which remains flat at 29° C. As far as RDHx pressure is concerned, it remains flat at 10 psi till 2129 s before dropping to 7 psi.

Figures 22A, 22B:
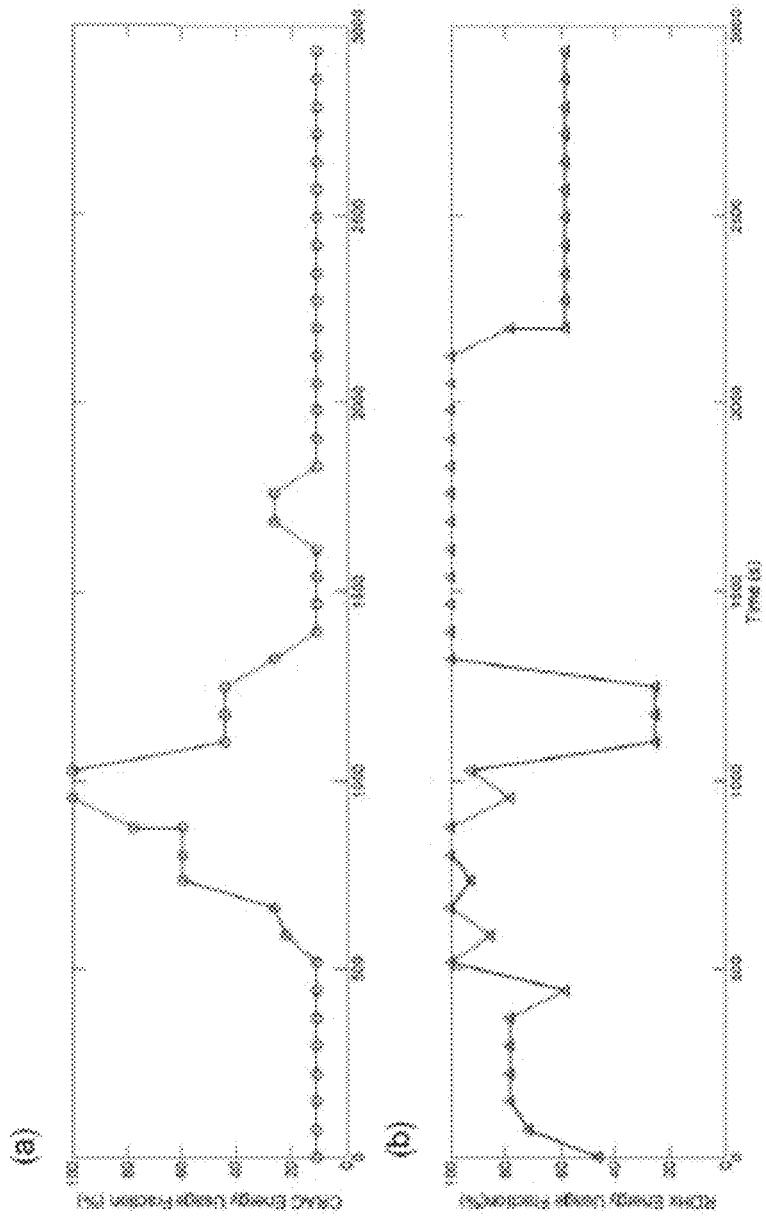
FIGS. 22a-b depict embodiments of cooling energy saving potential for Type-3 workloads.

The lines in the FIG. 21(c) and FIG. 21(d) show the most conservative set-points for CRAC (22.5° C.) and RDHx (10 psi), respectively. If there is no optimal control procedure, a risk-averse DC facility manager would operate his/her data center cooling at these conservative points. Therefore, the developed approach has the potential to save cooling energy. FIGS. 22a-b depicts cooling energy saving potential for Type-3 workloads, for example, the cooling energy saving potential of the developed optimization framework. FIG. 22(a) shows the fraction of energy usage by the CRAC unit operating in the optimal mode to that by a similar CRAC unit operating in the conservative mode. On the other hand, FIG. 22(b) shows the fraction of energy usage by the RDHx unit operating in the optimal mode to that by a similar RDHx unit operating in the conservative mode. The root mean square value of the fraction of energy saving in CRAC is equal to 66.2%. On the other hand, that value in RDHx is equal to 19%. It can be noted that the savings potential for the CRAC unit is significantly (more than 3 times) higher than that for the RDHx unit. This can be explained by the fact that the RDHx is closely coupled to the rack unit.

Figure 23A:
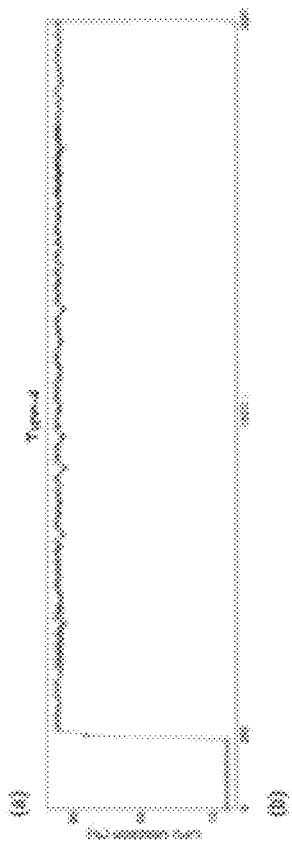
FIGS. 23a-d depict embodiments of optimal cooling resource allocation for Type-4 workload profiles.
Figure 23B:
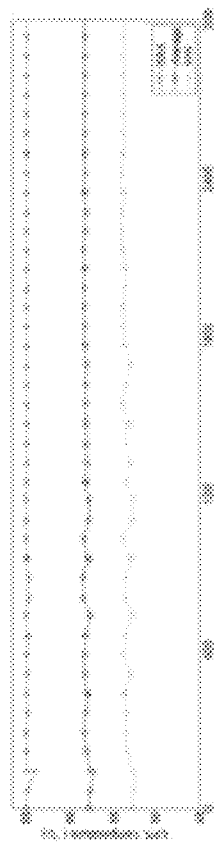
Figure 23C:
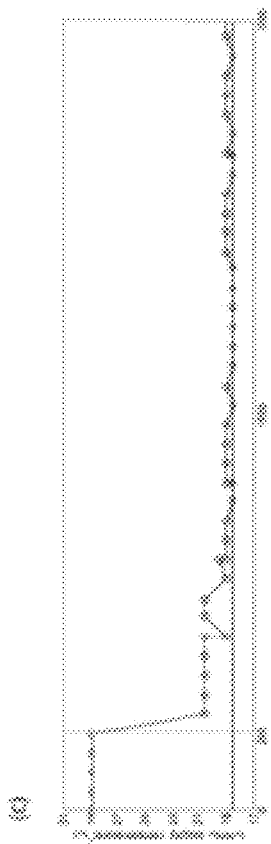
Figure 23D:
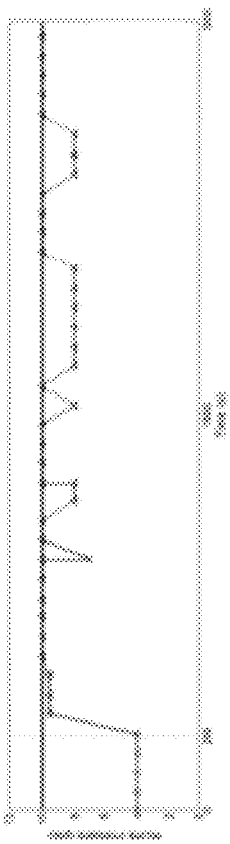

FIGS. 23a-d depict optimal cooling resource allocation for Type-4 workload profiles. FIG. 23(a) shows the load profile for Type-4. This profile is characterized by its sudden jump at 280 s. While this profile has (0.24±0.0126) % CPU utilization before 280 s, it shoots up to (98.38±1.14) % CPU utilization after 280 s. FIG. 23(b) shows the maximum, average, and minimum CPU temperature profiles for the optimal cooling set-point envelope. The optimization procedure determines the most cost-effective cooling set-points under the given constraint. FIG. 23(c) and FIG. 23(d) show optimal CRAC supply temperature and RDHx pressure set points, respectively. Initially, the CRAC supply temperature and RDHx pressure could satisfy the temperature constraint by operating at the most cost-effective set point of (29° C., 4 psi). With increase in CPU utilization and associated CPU power dissipation, cooling set-points need to deviate from the cost-efficient operational mode. As expected, there are major changes in cooling set-points around the discontinuities of the step profile at 280 s: while CRAC supply temperature increases from 29° C. to 20.5° C., RDHx pressure increases from 4 psi to 9.5 psi. After 280 s, the cooling set-points encounter minor changes because the CPU utilization profile remains flat.

Figures 24A, 24B:
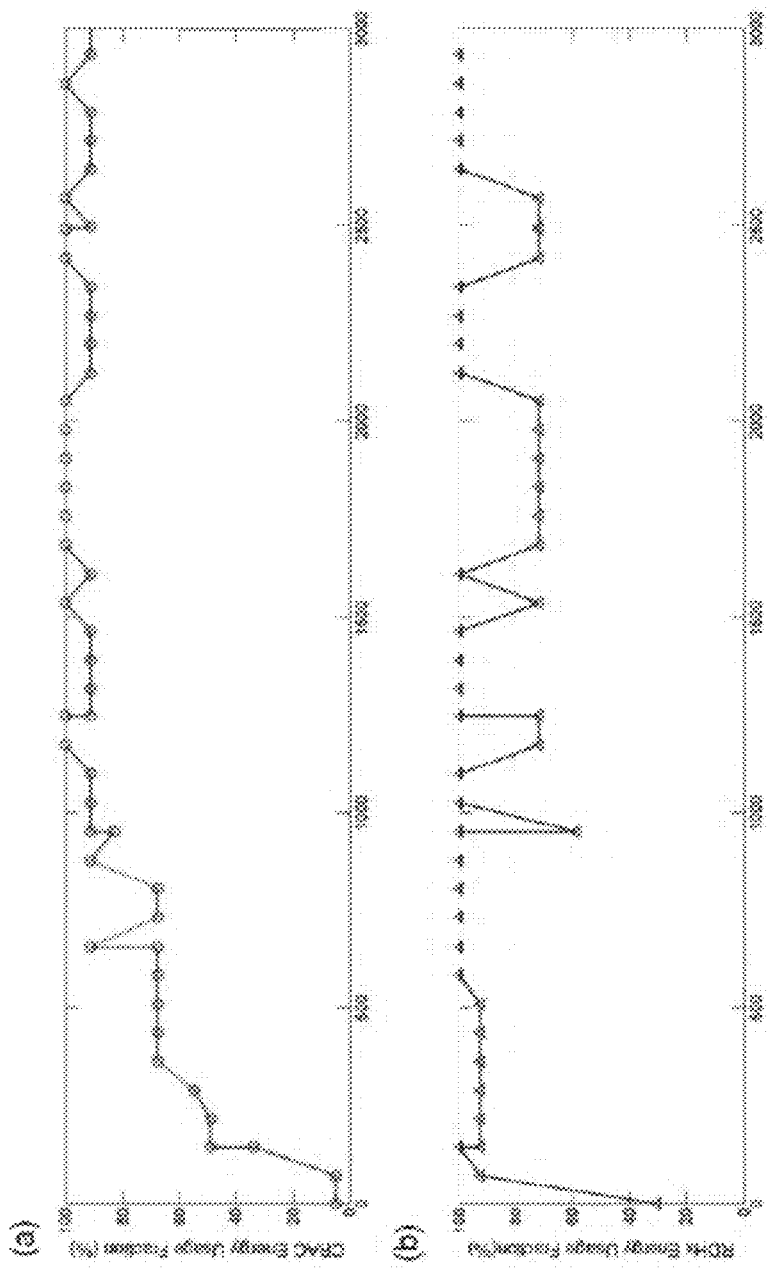
FIGS. 24a-b depict embodiments of cooling energy savings potential for type-4 workloads.
Figure 25:
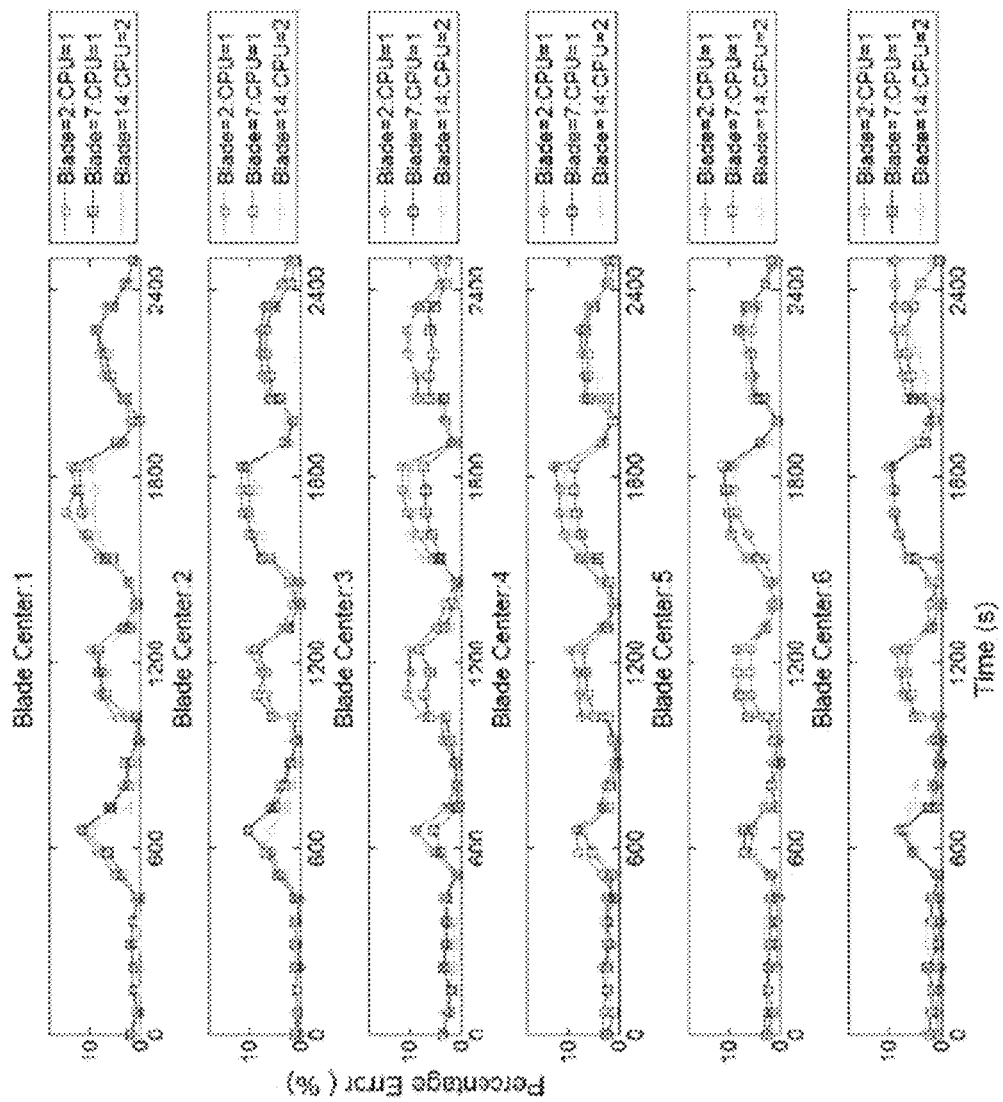
FIG. 25 depicts an embodiment of accuracy benchmarking for distorted Type-2 workload at (27° C., 5.5 psi) operating point.

The lines in FIG. 23(c) and FIG. 23(d) show the most conservative set-points for CRAC (18.5° C.) and RDHx (10 psi), respectively. If there is no optimal control procedure, a conservative DC facility manager would operate his/her data center cooling at these cost-efficient points. Therefore, the developed approach has the potential to save cooling energy. FIGS. 24a-b show the cooling energy saving potential of the developed optimization framework (Type 4 workload). FIG. 24(a) shows the fraction of energy usage by the CRAC unit operating in the optimal mode to that by a similar CRAC unit operating in the conservative mode. On the other hand, FIG. 24(b) shows the fraction of energy usage by the RDHx unit operating in the optimal mode to that by a similar RDHx unit operating in the conservative mode. The root mean square value of the fraction of energy saving in CRAC is equal to 15.7%. On the other hand, that value in RDHx is equal to 10.5%. It can be observed that the CRAC energy saving for Type-4 workload is 4 times smaller compared to other profiles. This is due to the resource intensive nature of workload: CPUs are utilized at (98.38±1.14) % load for 90.66% percentage of the time window.

An interesting trend can be observed if the cooling power savings for different types of workloads are compiled, as done in Table 3. It can be seen that the cooling power savings are maximum for Type-2 workload with 62.7% average CRAC power savings and 34.4% average RDHx power savings. On the other hand, the cooling power savings are marginal for Type-4 workload with 13.9% average CRAC power savings and 10% average RDHx power savings. It can be inferred from this trend that savings are higher for the work-loads with higher discontinuities. Unlike Type-2 workload, Type-4 workload is very steady. Therefore, the controller does not have an opportunity to modulate CRAC supply temperature and RDHx pressure set-points. That amounts to workload-proportional cooling resource allocation which enables activity-based costing for data center cooling.

TABLE 3

Workload dependent cooling power saying

| Workload | CRAC Power Savings | RDHx Power Savings |
|---|---|---|
| Type-1 | 51.4% | 18.5% |
| Type-2 | 62.7% | 34.4% |
| Type-3 | 66.2% | 19% |
| Type-4 | 13.9% | 10% |

The proposed method demonstrates high-fidelity prediction for the static workload profile. However, data center workload is stochastic in nature. Therefore, it is worthwhile to assess if the proposed method can take care of uncertainty in the workload profile. In that endeavor, it is hypothesized that the POD-based analyses of the CPU temperature data generated from Type-2 workload can predict CPU temperature data of generated from the distorted Type-2 workload profile. The prediction fidelity is estimated for three validation points: (19° C., 8.5 psi), (23° C., 6.0 psi), and (27° C., 5.5 psi). FIG. 62 shows the accuracy benchmarking for distorted Type-2 workload at (27° C., 5.5 psi) operating point. It can be observed maximum percentage error is 14.5%. Also, it can be observed that the framework is particularly error-prone at the points of discontinuities (600 s, 1200 s, 1800 s, 2400 s).

The root mean square (RMS) value of the time-average percentage error is equal to 4.49%. Similar analyses are conducted for cooling points (23° C., 6.0 psi) and (19° C., 8.5 psi). Table 7 compiles the prediction uncertainty for different cooling set-points. It includes maximum error, RMS error, mean error, standard deviation of error, and percentage of predictions with more than 10% error.

Figure 27:
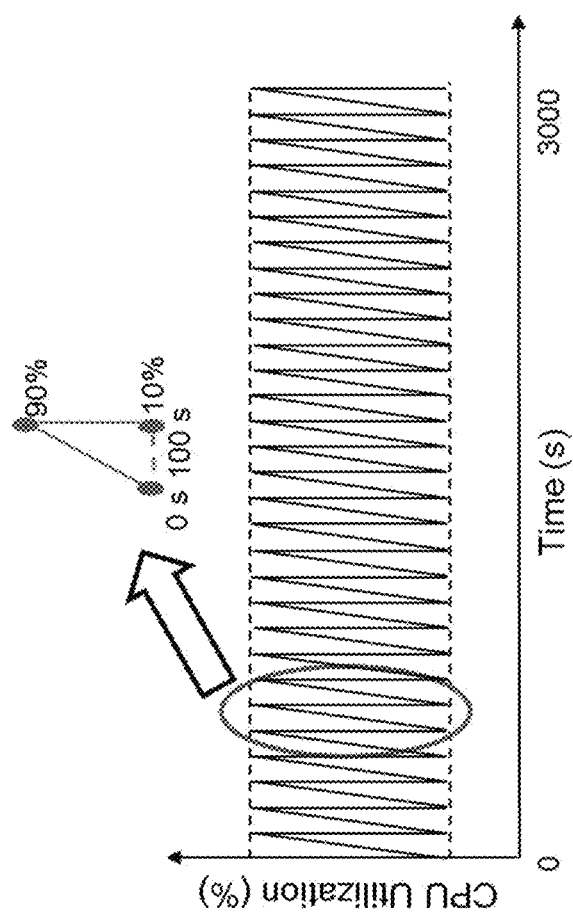
FIG. 27 depicts an embodiment of an extreme variation profile.

In order to determine if the proposed methods can handle extreme variations in workloads, a simulation of an extreme variation profile can be performed. For example, FIG. 27 depicts an extreme variation profile simulated by a saw-tooth waveform. Since the proposed framework is data-driven, it is imperative that the robustness of the framework be verified for the extreme variation profile where the CPU utilization fluctuates rapidly. The building block for this profile is a saw-tooth for which the CPU utilization varies between 10% to 90% in 100 s. In a 3000 s measurement window, there are 30 such saw-tooth elements. Table 4 depicts maximum and RMS errors for the extreme interrogation load.

TABLE 4

Error table when the interrogation load is Extreme

| Training Load | Interrogation Load | Cooling Conditions | Max Error | RMS Error |
| --- | --- | --- | --- | --- |
| Type-1 | Extreme | (19° C., 8.5 psi) | 10.16% | 3.85% |
| Type-1 | Extreme | (27° C., 5.5 psi) | 9.90% | 3.01% |
| Type-2 | Extreme | (19° C., 8.5 psi) | 12.76% | 5.38% |
| Type-2 | Extreme | (27° C., 5.5 psi) | 11.64% | 4.71% |
| Type-3 | Extreme | (19° C., 8.5 psi) | 11.17% | 4.26% |
| Type-3 | Extreme | (27° C., 5.5 psi) | 11.87% | 3.35% |
| Type-4 | Extreme | (19° C., 8.5 psi) | 14.12% | 4.57% |
| Type-4 | Extreme | (27° C., 5.5 psi) | 14.80% | 4.10% |

As illustrated in Table 4, the maximum errors vary between [9.90%-14.80%], and the RMS errors vary between [3.01%-4.57%]. Further, the data in Table 4 indicates that the proposed data-driven modeling framework can generate high-fidelity CPU temperature predictions in response any interrogation workload profile starting from any workload data primitive within the parametric domain spanned by the cooling set-points.

Since the percentage errors vary rapidly with time, the fidelity verification of a data driven based framework necessitates assessing maximum percentage error. Nevertheless, the root mean square error should be noted to understand overall predictive performance of the modeling framework. Besides simulated workloads, a real workload, namely Nutch, an open source web crawler, is used as the interrogation load. For example, Table 5 depicts prediction errors for the real workload profile, Nutch, at under-provisioned cooling operating point.

TABLE 5

Error table at (27° C., 5.5 psi) when the interrogation load is Nutch

| Training Load | Interrogation Load | Max Error | RMS Error |
| --- | --- | --- | --- |
| Type-1 | Nutch | 14.4% | 4.40% |
| Type-3 | Nutch | 16.0% | 5.40% |
| Type-3 | Nutch | 11.8% | 3.90% |
| Type-4 | Nutch | 20.8% | 9.30% |

In Table 5, the prediction errors are identified by using CPU temperature data generated with different primitive loads as the training data. The CPU workload of Nutch varies rapidly; therefore, it is imperative that the prediction error will be higher with a constant primitive load such as type-4 workload.

The POD-based framework is applied on the measured CPU temperature data to improve its parametric granularity. While CPU temperature is used as the response variable, a combination of CRAC supply temperature ($T_{sup}$) and RDHx differential pressure ($\Delta P_{RDHx}$) is used as a predictor variable. The objective function is to improve the parametric granularity of CPU temperature data in ($T_{sup}$, $\Delta P_{RDHx}$) parametric space. This paper applies the framework on CPU temperature data collected with 12 different combinations of ($T_{sup}$, $\Delta P_{RDHx}$). The output is generated for three different prediction points. FIG. 13 shows the parametric input space. There are four different levels of $T_{sup}$: 17° C., 21° C., 25° C., and 29° C. These temperature points are chosen to keep this experimental study pertinent to American Society of Heating, Refrigerating and Air-Conditioning Engineers (ASHRAE) TC9.9 recommended thermal guideline. While 21° C. and 25° C. lie within the recommended range of [18° C.-27° C.], 17° C. and 29° C. lie within the allowable range of [15° C.-32° C.]. On the other hand, three different values of RDHx differential pressure are chosen: 4.0 psi (27579 Pa), 7.0 psi (48263.3 Pa), and 10.0 Psi (68947.6 Pa) from possible values between [0-12 psi]. For the rest of the paper, psi will be used as a pressure unit (1 psi=6894.75 Pa). Indicated by the red circles, three output points are chosen at the furthest possible parametric locations: (19° C., 8.5 psi); (23° C., 6.0 psi); and (27° C., 5.5 psi).

These output points are arbitrarily chosen and drawn from different regions of the parametric space. Therefore, it can be argued that if any framework predicts accurately in these point, it will predict accurately in the entire parametric region. For example, Table 6 depicts maximum and RMS errors for different permutations of primitive and interrogation workloads at (27° C., 5.5 Psi). This is important because training workload and application workload rarely match.

TABLE 6

Error table at (27° C., 5.5 psi) when the interrogation load is different form the training load

| Training Load | Interrogation Load | Max Error | RMS Error |
| --- | --- | --- | --- |
| Type-1 | Type-2 | 14.04% | 5.12% |
| Type-1 | Type-3 | 8.64% | 2.99% |
| Type-1 | Type-4 | 12.07% | 5.67% |
| Type-2 | Type-1 | 13.72% | 4.86% |
| Type-2 | Type-3 | 14.32% | 4.58% |
| Type-2 | Type-4 | 13.75% | 7.18% |
| Type-3 | Type-1 | 10.87% | 2.98% |
| Type-3 | Type-2 | 12.56% | 4.42% |
| Type-3 | Type-4 | 12.07% | 6.53% |
| Type-4 | Type-1 | 15.09% | 5.26% |

TABLE 6-continued

Error table at (27° C., 5.5 psi) when the interrogation
load is different form the training load

| Training Load | Interrogation Load | Max Error | RMS Error |
|---|---|---|---|
| Type-4 | Type-2 | 15.95% | 6.20% |
| Type-4 | Type-4 | 14.58% | 5.61% |

It can be expected that if the framework is reasonably accurate for one cooling point, it would be of high-fidelity within the entire parametric domain. All twelve possible permutations of primitive and interrogation are tested. As expected, the numerical values of errors are higher when the interrogative workload is different from the primitive workloads. Thus, Table 6 confirms that for any possible permutation of primitive and interrogation, the maximum prediction uncertainty of the proposed framework is 15.95%.

TABLE 7

Prediction uncertainty for distorted Type-2 profile

| Cooling Set-Point | Maximum Error | RMS Error | Mean Error | Standard Deviation of Error | Percentage of Predictions with more than 10% error |
|---|---|---|---|---|---|
| (19° C., 8.5 psi) | 19.31% | 5.22% | 5.15% | 0.61% | 12.75% |
| (23° C., 6.0 psi) | 14.28% | 4.84% | 4.82% | 0.39% | 10.98% |
| (27° C., 5.5 psi) | 14.5% | 4.49% | 4.46% | 0.47% | 6.56% |

Table 8 suggests maximum prediction uncertainty for this framework is 6.98%.

TABLE 8

Upper limit of 99.7% (3σ) confidence interval (CI)

| Cooling Set-Point | Upper-limit of 99.7% CI |
|---|---|
| (19° C., 8.5 psi) | 6.98% |
| (23° C., 6.0 psi) | 6.01% |
| (27° C., 5.5 psi) | 5.87% |

From the error tables it is clear that the similarity between training and interrogation load profiles yields better prediction accuracy. For Nutch, the predictive fidelity is better with Cloud or Enterprise as the training workload. Therefore, the application of a particular compute rack or data center should guide the choice of training workload. Based on the error tables presented, previously following a guideline for training workload choice.

TABLE 9

Guideline for Training Workload Choice

| Data Center/Compute load Application | Training Workload |
|---|---|
| Online Merchandise | Cloud |
| Financial | Batch |
| Consumer service | Cloud |
| Enterprise IT application | Enterprise |
| Research and Development | HPC |

It is conceded that the present version of the proposed framework can handle only relatively smoother variations in workload profiles. It is noted that the percentage errors are rapidly shooting up at the points of discontinuities. Therefore, it seems the proposed POD-based modeling framework would be of low-fidelity in case the work profile varies rapidly. To overcome that limitation, an additional parameter representing the workload variation intensity needs to be included in the POD-based formulation. This workload variation intensity would affect the heat dissipation from the computing chip and affect the CPU temperatures. Additionally, dynamic CPU temperatures would be affected by the computing chip thermal mass. The fluctuating nature of a particular workload profile can be modeled by the average time differential, θ of the workload. For a dynamic workload, W(t), this factor can be defined as:

$$\theta = \frac{\int_0^\tau \frac{dW(t)}{dt} dt}{\int_0^\tau dt}.$$

Figure 26:
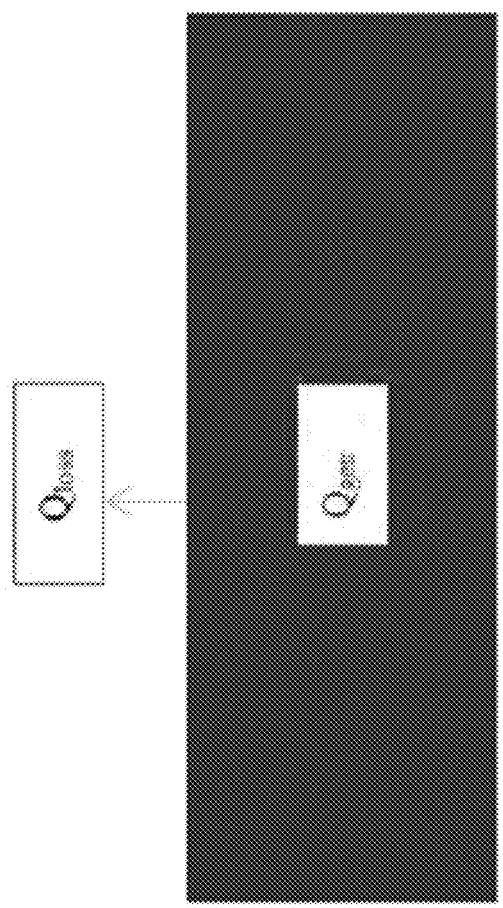
FIG. 26 depicts an embodiment of a thermodynamic model for CPU temperature evolution

Ultimately, this factor θ would affect the volumetric heat generation in the computing chip. In turn, that will affect heat dissipation from the chip and CPU temperatures. The CPU temperature can be modeled as a thermodynamic process variable. FIG. 26 depicts a thermodynamic model for CPU temperature evolution. FIG. 26 further shows the control volume for modeling chip heat transfer processes. The conservation of energy for this control volume yields:

$$\left. \begin{array}{l} \rho c V \frac{dT}{dt} = \dot{Q}_{gen} - \dot{Q}_{loss.} \\ \rho cV: \text{CPU thermal mass.} \\ T: \text{CPU temperature} \\ t: \text{Time.} \\ \dot{Q}_{gen} \propto \theta: \text{The heat generation is } proportioanl \text{ to } \theta. \\ \dot{Q}_{loss} = UA(T - T_{sur}): \text{Dependent upon the cooling environment} \end{array} \right\}$$

As discussed above, CPU temperatures can be expressed in POD modal space as follows:

$$\left. \begin{array}{l} T = T_0(In) + \Psi(In) \otimes b(D, \theta). \\ In: \text{Independent Variables} \\ D: \text{Dependent Parameters other than } \theta \end{array} \right\}$$

The CPU temperatures expressed in POD modal space can be plugged back into equation above and POD coefficient b(D, θ) can be determined by solving this equation numerically. A measurement-based framework is developed with CPU temperature as response variable and cooling, set-points as the parameters. It is demonstrated that the framework is capable of generating CPU temperature data within 7% prediction uncertainty. Together with logarithmic time computational efficiency and accuracy, the framework is a useful state-space generator for designing optimal cooling control with respect to time-varying IT workload profile.

In some embodiments, a data ensemble, $T_i(In; D_i) \in R^{m \times n}$, is generated. The data ensemble can be generated using historical data, such as from physical experiments, or simulation data (especially prevalent simulation method is computational fluid dynamics (CFD)). In some embodiments, the data ensemble is used as an input to a POD. The data ensemble may include a parameter independent part and a parameter dependent part, including (In;$D_i$) as the input to the data ensemble. While In is the independent variable field for the data ensemble, D is the dependent variable field. The subscript, i indicates parametric data ensemble. The ensemble is compiled over n-dimensional parametric space spanned by $D_i$. The row dimension, m indicates the dimensionality of the independent variable or predictor space.

The first step of a POD model is to compute the parametric-average of the data ensemble:

$$T_0(In) = \frac{\sum_{i=1}^{n} T_i(In; D_i)}{n}, \in R^{m \times 1}.$$

The parameter-dependent part of the data ensemble is modeled as:

$$T^*_i(In;D_i) = [T_i(In;D_i) - T_0(In)];\ T^* \in R^{m \times n}.$$

In some embodiments, the method further includes calculating POD modes for the data ensemble. By using POD-based modal decomposition, $T^*$ is expressed as the product of a low-rank matrix with corresponding weighting scalars. The low-rank matrix is the compilation of optimal basis functions, called POD modes. The weight scalars are called POD coefficients. While POD modes are independent of parameters, POD coefficients are parameter dependent.

The attractive feature of POD modes lies in their optimality in the sense that N POD modes convey more information about the data response surface than any other basis functions generated by comparable decompositions such as fast Fourier transform (FFT). The mathematical statement of the optimality is that the optimal basis functions, $\psi$ should maximize $\langle |T^*, \psi|^2 \rangle$ with a constraint $\|\psi\|^2 = 1$. The corresponding functional for this constrained variational problem is:

$$J(\psi) = \langle |T^*, \psi|^2 \rangle - \lambda(\|\psi\|^2 - 1).$$

The necessary condition for the optimization suggests that the functional derivative of $J(\psi)$ tends to zero with all variations in $\psi + \delta\theta \in L^2([0,1])$, $\delta \in R$:

$$\frac{d}{d\delta} J[\psi + \delta\theta]_{\delta=0} = 0.$$

The simplification of the previous equation for a discrete data ensemble leads to the governing equation for POD modes:

$$Ru = \lambda u.$$

This is an eigenvalue equation with $$R = \frac{1}{m}(T^*)^{Tr}T^*;$$

the superscript 'Tr' denotes the transpose of the matrix. The eigenvalues indicate the importance of corresponding POD modes in the data response surface. Larger $\lambda$s have larger relative information contents of the data response surface. The solution of the eigenvalue equation is performed via a power method-based numerical iterative procedure: First, assign a random unit vector, u. Second, iterate until it reaches convergence:

$$u := \frac{Ru}{\|Ru\|}.$$

Third, compute the POD mode as the dyadic product of $T^*$ and u:

$$\psi = T_d \otimes u, \psi \in R^{m \times n}.$$

The power method ensures rapid convergence time. Let $\{u_i\}$ be the eigenvectors of R and let $\{\lambda_i\}$ be the corresponding eigenvalues. Let, $x^k$ be the unit vector obtained after the $k^{th}$ iteration. Since $\{u_i\}$ are orthonormal:

$$\|Ru^k\|^2 = \frac{\sum_i \lambda_i^{2k+2}}{\sum_i \lambda_i^{2k}}.$$

Now, by the Holder's inequality:

$$\sum_i \lambda_i^{2k} \leq \left(\sum_i \lambda_i^{2(k+1)}\right)^{\frac{k}{k+1}} n^{\frac{1}{k+1}},$$

where n is the rank of the eigenspace

Rearrangement of the resulting inequality yields:

$$\frac{\sum_i \lambda_i^{2k+2}}{\sum_i \lambda_i^{2k}} \geq \frac{1}{n^{\frac{1}{k}}} \left[\sum_i \lambda_i^{2k}\right]^{\frac{1}{k}} \geq \frac{\lambda_1^2}{n^{\frac{1}{k}}}.$$

$$\Rightarrow \|Ru^k\|^2 \geq \frac{\lambda_1^2}{n^{\frac{1}{k}}}.$$

On the other hand, since $\{u_i\}$ are orthonormal:

$$\frac{\lambda_1^2}{n^{\frac{1}{k}}} \leq \|Ru^k\|^2 \leq \lambda_1^2.$$

This bound shows that $\|Ru^k\|^2$ asymptotically converges to $\lambda_1^2$. The left inequality suggests the minimum number of computational steps required for reaching a converged solution. At the $k^{th}$ iteration the ratio of the iterative solution to the converged solution is equal to $1/n^{1/k}$. A convergence criterion is chosen as $2^r$ such that:

$$\frac{1}{n^{\frac{1}{k}}} \sim 2^{-p} \cdot \Rightarrow \frac{\log_2(n)}{k} \sim p \cdot \Rightarrow k \sim \frac{\log_2(n)}{p}.$$

Since p is a machine dependence parameter, the time complexity of the Power method is on the order of log(n). The computational time for each POD mode is in the order of log(n). Therefore, the number of POD modes to describe a response surface within certain accuracy tolerance is a critical parameter for the efficiency of the model. Since an eigenvalue, $\lambda_i$ indicates the energy content of the corresponding POD mode, $\psi_i$, the minimum number of POD modes required to capture a certain percentage of energy or information content of a data set is given by, k:

$$\left(\frac{\sum_{i=1}^{k}\lambda_i}{\sum_{i=1}^{n}\lambda_i} > C.E.P\right) \cap (\min(k)),$$

where, C.E.P. is defined as the captured energy percentage by k POD modes. The previous equation indicates that k POD modes can predict a response surface within certain accuracy tolerance defined by the captured energy percentage (C.E.P.). In some embodiments, the method includes calculating POD coefficients for the data ensemble. The parametric component of the response surface is governed by the POD coefficients. The numerical method for computing POD coefficients at the interrogation parametric point is described as follows:

1. Compute the complete coefficient matrix:

$$B(D_{en}) = \psi^+ \otimes (T^*(\text{In};D_{en})), B \in \Re^{k \times n}.$$

The subscript "en" indicates the parameter related to the ensemble space.

2. Determine the POD coefficient, $b(D_{int}) \in \Re^{n \times 1}$ by applying multi-dimensional interpolation of B. The subscript "int" indicates the parameter related to the interrogation space. The computational steps for this multi-parameter interpolation are in the order of $\sim O(k \times n)$, which is considerably lower than direct interpolation of the data ensemble $\sim O(m \times n)$. It is because $k < n < m$.

Another approach to compute POD coefficient is kriging, which is an optimal interpolation scheme based on the regression of data points according to spatial covariance values. In some embodiments, a temperature at a new parametric point is determined based on the data ensemble. In an embodiment, the parametric response surface is generated by adding the parameter-independent component and the product of POD modes and POD coefficients:

$$T_{int}(\text{In};D_{int}) = T_0(\text{In}) + \psi(\text{In}) \otimes b(D_{int}).$$

As a meta-modeling technique, the accuracy of the POD-based framework is a critical design consideration. The modeling accuracy can be determined in two ways: a priori or a posteriori. While posterior error estimation is useful for assessing modeling fidelity, a priori error estimation, often analytical in nature, is a useful design capability for near-real-time POD-based controllers. The a priori error can be integrated into the control logic of the POD-based controller to yield high-precision reliable output. POD modeling error can be defined as the deviation of POD predictions from experimental data:

$$E_{Prediction} = (T_{Data} - T_{POD}).$$

A POD framework is reliable if it satisfies following fidelity condition:

$$E_{Prediction} \leq f \Delta T_{Scale}^{Measurement},$$

Where f is an operator dependent scalar, numerically varies between 0 and 1; $\Delta T_{Scale}^{Measurement}$ is the representative temperature scale of the problem.

The factor f quantified the degree of relaxation on the modeling accuracy. If f is equal to 1, the model is highly relaxed because the model is allowed to incur error equal to $\Delta T_{Scale}^{Measurement}$. Conversely, as f tends to 0, the accuracy demand from the model increases proportionally. The analytical error can be defined as the deviation of POD predictions from the exact solution:

$$E_{Analytical} = (T_{Exact} - T_{POD})$$

A comprehensive a priori error estimation scheme should consider both interpolation and extrapolation-based POD/regression model. The interpolation is required when the interrogation point lies within the input parameter domain, otherwise extrapolation is required. While POD/interpolation error can be determined statistically; POD/extrapolation error estimation requires functional analysis of the governing differential equation.

For determining the analytical error of the POD/interpolation scheme, $E_{Analytical}^{POD/Interpolation}$, a linear algebra-based analysis can be used. For example, Let $T^1, T^2, \ldots, T^l$ be snapshots and let $\zeta := \text{span}\{T^1, T^2, \ldots, T^l\} \in T$ with $m := \dim(\zeta)$. Assume $\{\psi_i\}_{i=1}^m$ is an orthonormal basis of $\zeta$:

$$T^j = \sum_{i=1}^{m} (T^j, \psi_i)\psi_i, \text{ for } j = 1, \ldots l.$$

The fundamental principle of reduced-order modeling is finding $d(<m)$ orthonormal basis vectors $\{\psi_i\}_{i=1}^d \in T$ such that the mean square error between the elements of the ensemble set and corresponding $d^{th}$ partial sum is minimized on average:

$$\{\psi\}_{i=1}^{min} \frac{1}{l} \sum_{j=1}^{l} \left\| T^j - \sum_{i=1}^{d} (T^j, \psi_i)_v \psi_i \right\|_1^2,$$

subject to $(\psi_i, \psi_j) = \delta_{ij}$ for $1 \leq i \leq d, 1 \leq j \leq i$.

POD error can be reformulated:

$$\{\psi\}_{i=1}^{min} \frac{1}{l} \sum_{j=1}^{l} \left\| T^j - \sum_{i=1}^{d} (T^j, \psi_i)\psi_i \right\|_y^2 =$$

$$\{\psi\}_{i=1}^{min} \frac{1}{l} \sum_{j=1}^{l} \sum_{i=d+1}^{m} |(T^j, \psi_i)_1|^2 = \sum_{i=d+1}^{m} \lambda_i.$$

In addition, a constant, $c_0$, is multiplied to the sum of the eigenvalues corresponding to the discarded POD modes to fully specify $E_{Analytical}^{POD/Interpolation}$. The arbitrary constant, $c_0$, quantifies the interpolation error. For the POD/interpolation scheme, $E_{Analytical}^{POD/Interpolation}$, is given by:

$$E_{Analytical}^{POD/Extrapolation} = c_0 \sum_{i=k+1}^{n} \lambda_i.$$

For determining the analytical error of the POD/extrapolation scheme, $E_{Analytical}^{POD/Extrapolation}$, a weak formulation-based functional analysis, as documented in, is used. Instead of a weak formulation-based functional analysis for the Navier-Stokes equations as conducted in, the analytical error for the POD/extrapolation framework requires a functional analysis of the energy equation. The governing equation for the convective air temperature field, T(x,y,z,t) inside a data center is:

$$\frac{\partial T}{\partial t} - (\alpha + E_H)\nabla^2 T + \vec{u} \cdot \nabla T = \dot{q}.$$

In an embodiment, the initial condition is chosen to be independent of spatial locations: $T(t=0)=T_0$. The boundary conditions for air temperatures in a data center are often complicated: the boundary temperatures are chosen to be equal to zero. Both the Navier-Stokes equations and the energy equations are conservation equations; therefore, they have similar forms except the energy equation does not have the pressure gradient term like the Navier-Stokes equations. Nevertheless, the same analytical methodology is used considering that the pressure gradient term does not feature in the weak formulation.

$$(T_t, v) + a(T, v) + b(u, T, v) = (q, v).$$

$$a(T, v) := a \int_\Omega \nabla T : \nabla v dx, b(U, T, v) = \int_\Omega (U \cdot \nabla) T \cdot v dx.$$

The determination of the analytical error, $E_{Analytical}^{POD/Extrapolation}$, in is essentially a two-step procedure: first, the estimation of the deviation between the exact solution and the numerical solution, and second, the estimation of the deviation between the numerical solution and the reduced-order solution. Finally, the errors determined from previous two steps are added to obtain the bound for the deviation between the exact solution and the reduced-order model solution, $E_{Analytical}^{POD/Extrapolation}$. The deviation between the exact solution and the POD-based prediction is:

$$E_{Analytical}^{POD/Extrapolation} \le c_1(\sigma^{-1}(t_m)k + h^p) +$$

$$\left[\frac{l\exp(\theta)}{1-\theta}(c_2 + c_3 k)\sum_{n=d+1}^m \lambda_n\right]^{\frac{1}{2}}, c_4 k \le \theta < 1.$$

where, c1,c2,c3,c4 are arbitrary constants. $\sigma^{-1}(t)=\min(1, t)$. k:=Time step size.

$h^p$:=Finite element size. l:=Number of snapshots.

$\lambda_n$:=Eigenvalues corresponding to POD modes.

With k and $h^p$ featuring in equation above, it is evident that the discretization of the numerical scheme is an integral part for determining $E_{Analytical}^{POD/Extrapolation}$. The experimental data can be modeled as a discrete sample set of the solution space of the governing equation. For an experimentally-derived discrete dataset, the time step, k, can be modeled as the time difference between two consecutive observations, and the finite element size, $h^p$, can be modeled as the normalized distance between two neighboring sensors. After the functional form of the analytical error, $E_{Analytical}^{POD/Extrapolation}$, is determined, its complete specification involves a multi-dimensional optimization analysis.

It is apparent that complete determinations of $E_{Analytical}^{POD/Interpolation}$ and $E_{Analytical}^{POD/Extrapolation}$ require optimal numerical values for the empirical constants $c_0$ and $(c_1,c_2,c_3)$. In an embodiment, the numerical values of these constants depend on the specific initial data. The numerical values of these constants are determined via a statistical optimization procedure were the fractional difference between $E_{Analytical}$ and $E_{Prediction}$ is optimally minimized for the different values of optimization parameter(s): $c_0$ for the POD/interpolation framework, and $(c_1,c_2,c_3)$ for the POD/extrapolation framework. The fractional difference between $E_{Analytical}$ and $E_{Prediction}$ is defined as the error functional (e):

$$e = \frac{\text{abs}(E_{Prediction} - E_{Analytical})}{\text{abs}(E_{Prediction})}.$$

For the POD/interpolation framework, the optimization problem is:

$$\min[e(c_0)], c_0 \in R.$$

For the POD/interpolation framework, the optimization problem is:

$$\min[e(c_1,c_2,c_3)], (c_1,c_2,c_3) \in R.$$

$E_{Prediction}$, $E_{Analytical}$, and e are multi-dimensional vectors. The minimization of e is conducted statistically: for a given $c_0$ or $(c_1,c_2,c_3)$, e is calculated. Thereafter, average (μ) and standard deviation (σ) across the various dimensions of e are calculated:

$$\mu = \frac{\sum_i e_i}{dim(e)}.$$

$$\sigma = \left(\frac{1}{dim(e)-1}\sum_i (e_i - \mu)^2\right)^{\frac{1}{2}}.$$

A low value of μ suggests that average values $E_{Prediction}$ and $E_{Analytical}$ are proximal to each other. On the other hand, a low value of σ suggests the difference between $E_{Prediction}$ and $E_{Analytical}$ does not deviate much from μ. A low μ together with a low σ suggests $E_{Analytical}$ tends to approximate $E_{Prediction}$ within a confidence interval determined by μ. Such an approximation will obviate the necessity of a posteriori experimental measurements for estimating the validity of the POD-based framework. $T_{POD}$ can be directly added to $E_{analytical}$ to obtain a temperature value whose accuracy depends upon the quality of the optimization procedure. For difference values $c_0$ and $(c_1,c_2,c_3)$, different μ and σ can be obtained. The relative importance of μ and σ in the optimization framework can be mathematically quantified by a weighting factor, ω. To choose optimal values of $c_0$ and $(c_1,c_2,c_3)$, a unified decision-making index (I) can be modeled:

$$I=\omega\mu+(1\omega)\sigma.$$

For various choices of $c_0$ (for POD/interpolation) or $(c_1,c_2,c_3)$ (for POD/extrapolation), the choice that makes I smallest is the chosen parameter(s). It is recognized that the computation of $c_0$ and $(c_1,c_2,c_3)$ by comparing the analytical error to the prediction error reduces the effectiveness of the a priori framework. However, these constants depend on a particular experimental setup and POD prediction resolution. Therefore, once these constants are determined by a benchmarking experiment for a particular experimental facility, they can be recurrently used for subsequent predictions. An alternative approach can be developed by modeling error as:

$$e=(E_{Prediction}-E_{Analytical}).$$

In this approach, the computation of $c_0$ is conducted via the minimization of the inner product of e:

$$L=e^t \cdot e.$$

The candidate space for $c_0$ is determined by the bisection method. The efficiency of a numerical procedure can be defined by the number of iterations, n needed to achieve a given error, $\varepsilon$. For the bisection method, it is given by:

$$n = \log_2\left(\frac{\varepsilon_0}{\varepsilon}\right),$$

Where, $\varepsilon_0$ is the size of parametric domain. On the other hand, the analytical error for POD/Extrapolation is dependent on three arbitrary constants. One method to determine these constants is via iteration-based minimization of the decision-making index I. An alternative method is the conjugate gradient method-based optimization procedure. The ultimate purpose of analytical error is to match with prediction error:

$$E_{Analytical} \rightarrow E_{Prediction}.$$

$E_{Analytical}$ can be decomposed into two parts: one of these parts depends upon arbitrary constants and other part depends on time:

$$E_{Analytical} = F(t) \otimes g(c_i).$$

The determination of $c_i$ can be modeled as a least-square problem:

$$F^T E_{Prediction} = F^T F \, g.$$

Where $F^T E_{Prediction}$ is a column vector, $F^T F$ is a square symmetric matrix, and g is the vector with the constants $c_i$ as elements. The constants can be determined by the conjugate gradient method.

What is claimed:

1. A method for determining optimal operating set points in sync with dynamic demand responsive to time-varying events in a data center or a mission critical facility, the method comprising:
    establishing, by a matrix module executing on a computing device, a data matrix of a first set of critical data based on parametric operating set-points in the data center representing dynamic demand, the dynamic demand responsive to the time-varying events in the data center;
    generating, by a decomposition module executing on the computing device, new critical data as a new operating set-point;
    determining, by a prediction module executing on the computing device, optimal operating set points using the decomposition module until a pre-assigned reliability criterion is satisfied; and
    transmitting, by a communication module executing on the computing device, the optimal operating set points for the resources to a data center management module.

2. The method of claim 1, wherein the critical data include at least one of: junction temperatures for a central processing unit (CPU), IT equipment component temperatures, CPU utilization percentages, server inlet air temperatures, or a server exhaust air temperatures, and wherein the operating set-points could include cooling set-points such as CRAC supply/return air temperature, RDHx assembly cooling water pressure, chiller set-points, cooling tower set-points, or air/water side economizer set-points.

3. The method of claim 1, wherein generating the new critical data includes:
    calculating a parametric mean of the data matrix, and
    calculating a deviation matrix based on the parametric mean.

4. The method of claim 3, wherein generating new critical data includes:
    computing, by the decomposition module on the deviation matrix, optimal basis functions.

5. The method of claim 4, wherein generating new critical data includes:
    determining, by the decomposition module, weighing coefficients corresponding to the optimal basis function space.

6. The method of claim 5, wherein generating new critical data includes:
    adding, by the decomposition module, the parametric mean with a product of at least one optimal basis function and the corresponding weighting coefficients.

7. The method of claim 1, further comprises adjusting, by the prediction module, the operating set points responsive to a dynamic variation of the critical data.

8. The method of claim 7, further comprising decreasing, by the prediction module, a resource value.

9. The method of claim 7, further comprising increasing, by the prediction module, a resource value.

10. The method of claim 1, further comprising determining, by the prediction module, whether the critical data is below an operational reliability limit.

11. A system for determining optimal operating set points in sync with dynamic demand responsive to time-varying events in a data center, the system comprising:
    a matrix module executing on a computing device, the matrix module is configured to establish a data matrix of a first set of critical data based on parametric operating set-points in a dynamic data center or mission critical facility;
    a decomposition module executing on the computing device, the decomposition module is configured to generate new critical data based in part on the first set of critical data;
    a prediction module executing on the computing device, the prediction module is configured to determine optimal operating set points using the new critical data; and
    a communication module executing on the computing device, the communications module configured to transmit the optimal operating set points for the resources to a data center management module.

12. The system of claim 11, wherein the critical data include at least one of: junction temperatures for a central processing unit (CPU), IT equipment component temperatures, CPU utilization percentages, server inlet air temperatures, or a server exhaust air temperatures, and wherein the operating set-points include cooling set-points such as CRAC supply/return air temperature, RDHx assembly cooling water pressure, chiller set-points, cooling tower set-points, or air/water side economizer set-points.

13. The system of claim 11, wherein the decomposition module is configured to:
    calculate a parametric mean of the data matrix, and
    calculate a deviation matrix based on the parametric mean.

14. The system of claim 13, wherein the decomposition module is configured to compute optimal basis functions for the new critical data.

15. The system of claim 14, wherein the decomposition module is configured to determine weighing coefficients corresponding to a basis function space for the new critical data.

16. The system of claim 15, wherein the decomposition module is configured to add the parametric mean with a product of at least one optimal basis function and the weighting coefficients.

17. The system of claim 11, wherein the prediction module is configured to adjust the operating set points responsive to a dynamic variation of the critical data.

18. The system of claim 7, wherein the prediction module is configured to perform at least one of decreasing a resource value or increasing the resource value.

19. The system of claim 11, wherein the prediction module is configured to determine whether the critical data is below an operational reliability limit.

20. The system of claim 11, wherein the data center management module is executing on the same computing device or a remote computing device, remote to each of the matrix module, decomposition module, prediction module, and communication module, and is communicatively coupled to each of the matrix module, decomposition module, prediction module, and communication module.

* * * * *